(12) United States Patent
Lilak et al.

(10) Patent No.: US 11,658,183 B2
(45) Date of Patent: May 23, 2023

(54) METALLIZATION STRUCTURES UNDER A SEMICONDUCTOR DEVICE LAYER

(71) Applicant: Intel Corporation, Santa Clara, CA (US)

(72) Inventors: Aaron D. Lilak, Beaverton, OR (US); Rishabh Mehandru, Portland, OR (US); Patrick Morrow, Portland, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 17/372,345

(22) Filed: Jul. 9, 2021

(65) Prior Publication Data

US 2021/0343710 A1 Nov. 4, 2021

Related U.S. Application Data

(62) Division of application No. 16/615,378, filed as application No. PCT/US2017/040549 on Jul. 1, 2017, now Pat. No. 11,107,811.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 23/528* (2013.01);
(Continued)

(58) Field of Classification Search
CPC ............ H01L 27/0886; H01L 29/7931
See application file for complete search history.

(56) References Cited

U.S. PATENT DOCUMENTS

| 10,332,790 B2 | 6/2019 | Chang et al. |
| 2011/0068407 A1 | 3/2011 | Yeh et al. |

(Continued)

FOREIGN PATENT DOCUMENTS

| KR | 20160147618 | 12/2016 |
| WO | 2017052604 | 3/2017 |
| WO | 2017105515 | 6/2017 |

OTHER PUBLICATIONS

International Preliminary Report on Patentability from PCT/US2017/040549 dated Jan. 16, 2020, 9 pgs.
(Continued)

*Primary Examiner* — Yu-Hsi D Sun
(74) *Attorney, Agent, or Firm* — Essential Patents Group, LLP

(57) ABSTRACT

Metallization structures under a semiconductor device layer. A metallization structure in alignment with semiconductor fin may be on a side of the fin opposite a gate stack. Backside and/or frontside substrate processing techniques may be employed to form such metallization structures on a bottom of a semiconductor fin or between bottom portions of two adjacent fins. Such metallization structures may accompany interconnect metallization layers that are over a gate stack, for example to increase metallization layer density for a given number of semiconductor device layers.

13 Claims, 19 Drawing Sheets

(51) Int. Cl.
  *H01L 23/528* (2006.01)
  *H01L 23/532* (2006.01)
  *H01L 27/06* (2006.01)
  *H01L 29/78* (2006.01)

(52) U.S. Cl.
  CPC .... *H01L 23/53228* (2013.01); *H01L 27/0688* (2013.01); *H01L 29/785* (2013.01)

(56) References Cited

U.S. PATENT DOCUMENTS

| | | |
|---|---|---|
| 2016/0197069 A1 | 7/2016 | Morrow et al. |
| 2018/0151732 A1* | 5/2018 | Mehandru ............ H01L 29/7848 |
| 2018/0219090 A1* | 8/2018 | Morrow ............ H01L 29/41791 |
| 2018/0315838 A1 | 11/2018 | Morrow et al. |
| 2019/0027503 A1 | 1/2019 | Lilak et al. |

OTHER PUBLICATIONS

International Search Report and Written Opinion from PCT/US2017/040549 dated Feb. 23, 2018, 12 pgs.
Notice of Allowance from U.S. Appl. No. 16/615,378 dated May 5, 2021, 9 pgs.
Restriction Requirement from U.S. Appl. No. 16/615,378 dated Feb. 2, 2021, 7 pgs.

* cited by examiner

US 11,658,183 B2

METALLIZATION STRUCTURES UNDER A SEMICONDUCTOR DEVICE LAYER

CLAIM OF PRIORITY

This application is a Divisional of, and claims priority to, U.S. patent application Ser. No. 16/615,378, filed Nov. 20, 2019 and titled "METALLIZATION STRUCTURES UNDER A SEMICONDUCTOR DEVICE LAYER", which is a National Stage Entry of, and claims priority to, PCT Application No. PCT/US2017/040549, filed on Jul. 1, 2017 and titled "METALLIZATION STRUCTURES UNDER A SEMICONDUCTOR DEVICE LAYER", which is incorporated by reference in its entirety for all purposes.

BACKGROUND

Microelectronic device fabrication typically includes multiple levels of metallization over a device layer. Metallization under a device layer may be advantageous, for example as a path toward 3D monolithic integration, but device structures and techniques for forming such structures are not yet practiced.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
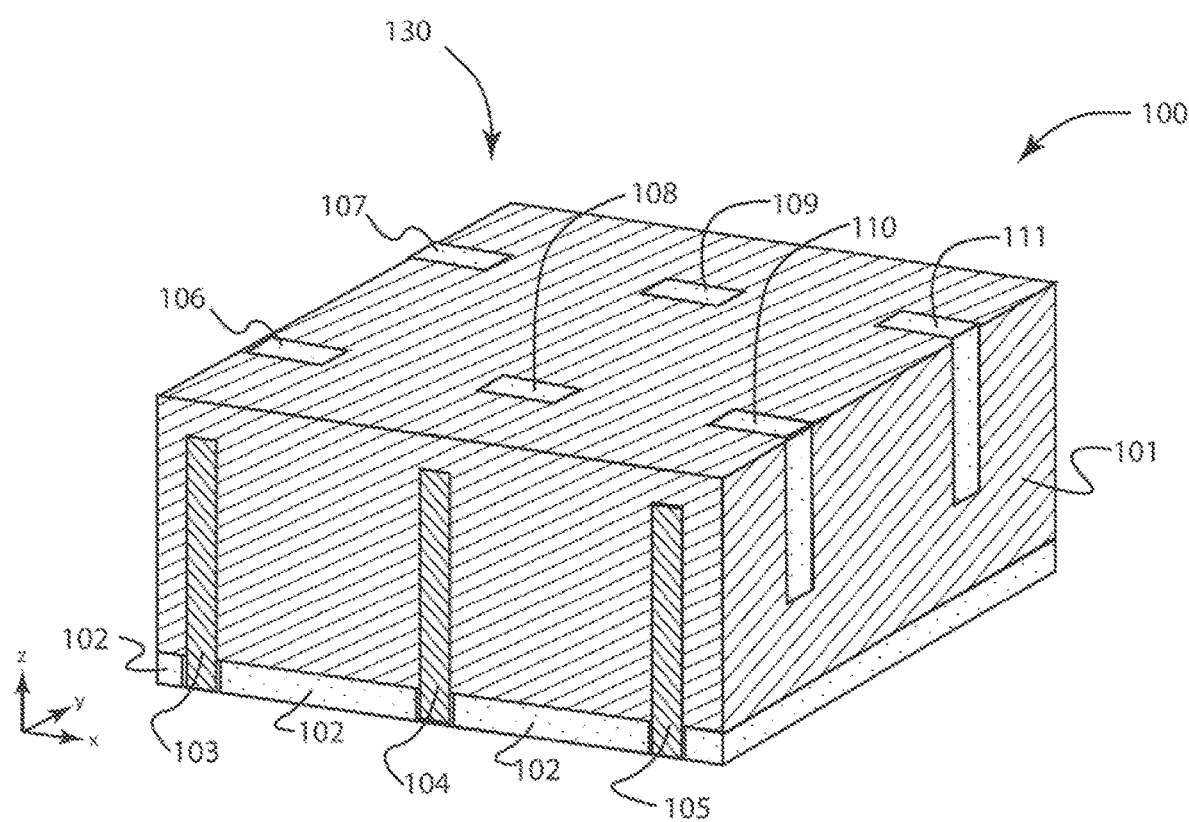
FIG. 1A illustrates a topside isometric view of a multi-fin transistor device layer embedded in an isolation dielectric, in accordance with some embodiments.

In finFET device architecture, devices include one or more high aspect ratio semiconductor fins, formed for example by etching parallel sidewall trenches in bulk or semiconductor-on-insulator (SOI) substrates. The fin is then employed at least for the channel of the FET transistor. A gate stack wraps over a sidewall, a perhaps also the tops of the fins. The drain and source regions of the field effect transistors (FETs) couple to the fin on opposite sides of the gate stack. Gaps between fin sidewalls may be a few nanometers to tens of nanometers wide. The gaps may be filled with a dielectric material, such as a silicon oxide. Further metallization may follow to introduce metal electrodes on the transistors, as well as interconnect structures.

For high density arrays of transistors, it may be advantageous to have metallization over the transistors, but also under the transistors, (i.e., on the back side of the substrate or within the bulk of the substrate). It may also be advantageous to have such metallization routed as close as possible to a fin of a transistor. A number of structures with metallization under the device semiconductor, and methods of fabrication are described herein.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification and in the claims, spatial orientation references are made by the terms "top", "bottom", "under", "adjacent", "side", "below" and "above". These terms indicate position of an object relative to another object.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Notably, while the figures and description are provided in the context rectangular fin structures, this is merely for clarity. Corner rounding and sidewall slopes and non-orthogonal intersections may of course result from imperfections that can be expected to exist in any manufacturing process. Hence, in practice a fin structure cross-section may be trapezoidal, hourglass shaped, necked with one or more indentations, another shape (e.g., a nanowire, nanosheet or nanoribbon) including multiple alternating semiconductor and insulator regions, etc.

FIG. 1A illustrates a topside isometric view of a multi-fin transistor device structure 100 according to the embodiments of this disclosure. The isometric view of FIG. 1A and isometric views of subsequent figures of this disclosure will be understood to illustrate only representative portions or truncations of a larger integrated circuit. It is further understood that device structure 100 comprises a plurality of repeating rows of fins and intervening trenches extending along the x-axis of the FIG. 1A. Device structure 100 includes fins 103, 104 and 105. Fins 103-105 may be any suitable semiconductor material, such as, but not limited to group IV materials (e.g., silicon, germanium, silicon-germanium alloy), group III-V material (e.g., gallium arsenide, indium phosphide, indium arsenide), III-N materials such as gallium nitride, II-VI materials such as cadmium telluride. Fins 103-105 may also be, in some alternative embodiments, comprise a semiconductor oxide such an indium gallium zinc oxide (IGZO), etc. In exemplary embodiments, fins 103-105 are substantially monocrystalline. Alternative embodiments where fins 103-105 are polycrystalline (e.g., nanocrystalline, microcrystalline) thin films are also possible. Fins 103-105 comprise one row of fins. Structure 100 further comprises columns of fins, with each column extending along the y-axis of FIG. 1A. Each fin is associated with a transistor (e.g., FET). In some embodiments, an integrated circuit includes other passive or active devices (not depicted) accompanying the transistors.

In device structure 100, metallization structures 102 are embedded within trenches in isolation 101, and between adjacent fins 103-105. Isolation 101 may comprise any conventional dielectric or low-k dielectric known to be suitable for FET isolation structures, such as, but not limited to, silicon oxides (SiO) silicon nitrides (SiN), silicon oxynitride (SiON), carbon-doped oxide (SiOC(H)), MSQ, HSQ, porous dielectrics. Metallization structures 102 include any material having electrical and/or thermal conduction characteristics significantly greater than those of fins 103-105. In some embodiments, metallization structures 102 are copper or an alloy of copper. In some other embodiments, metallization structures 102 are aluminum or an alloy of aluminum. In some other embodiments, metallization structures 102 comprise at least one of tungsten, titanium, ruthenium, or tantalum. Other metals are also possible (e.g., gold, silver, cobalt, etc.). In some embodiments, metallization structures 102 are a semimetal such as, but not limited to, graphite, graphene, metal silicides, etc. Top surfaces of gate stacks 106-111 are also visible in FIG. 1A. Each gate stack includes a gate electrode material separated from a fin by a gate dielectric material. The gate electrode may be any suitable material(s), such as, but not limited to, doped semiconductor and metals having a desired workfunction. The gate dielectric material may be of any conventional permittivity (e.g., silicon dioxide) or high-k dielectric (e.g., bulk relative permittivity over 9) material (e.g., HfO2, Al2O3, other metal oxides, and metal silicates).

Figure 1B:
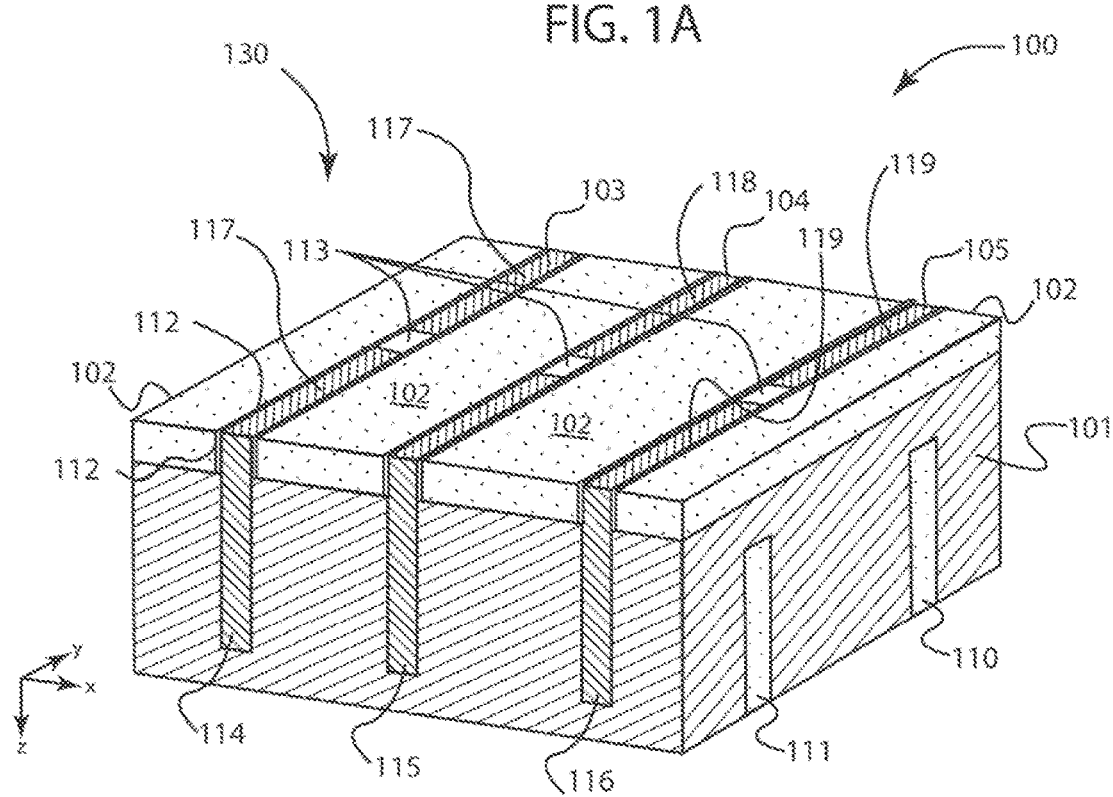
FIG. 1B illustrates an inverted isometric view of the multi-fin transistor device layer, revealing metallization structures on the bottom of the device along trenches between fins, in accordance with some embodiments.

FIG. 1B illustrates an inverted isometric view of multi-fin transistor device structure 100, further showing metallization structures 102 on the bottom or underside of device structure 100, according to some embodiments of the disclosure. In FIG. 1B, bottom surfaces 117-119 of fins 103-105, and 106, 107 and 108 are shown. Metallization structures 102 extend between adjacent ones of fins 103-108, embedded within a base of isolation dielectric layer 101. With the exemplary fins 103-108 being linearly spaced, metallization structures 102 are linear (i.e., lines). In the illustrated embodiment, a bottom surface of metallization structures 102 is substantially planar with bottom fin surfaces 117-119. In some further embodiments, a dielectric liner 112 intervenes between sidewalls of fins 103-105 and metallization structures 102, as described in greater detail below. Dielectric liner 112 may, for example, electrically insulate and/or prevent inter-diffusion between metal lines and adjacent fins. As further shown in FIG. 1B, plugs 116 separate fins 103-108. Plugs 116 may be any suitable dielectric material, such as, but not limited to, SiO, SiN, SiON, SiOC(H), MSQ, HSQ, porous dielectrics, etc. Short ends of adjacent fins are thus separated from each other by plugs 116. As will be described below, fins 103-108 comprise at least the channel region of the field effect transistors in device structure 100. Fins 103-108 may also comprise a source and a drain of the field effect transistors, or the source and drain may be coupled to opposite ends of fins 103-108. During operation, current flowing though the transistor body between source and drain is to be modulated by a voltage applied through gate stacks 106-111. During operation, current and/or heat may flow through metallization structures 102, independent of, or in association with, the operation of the adjacent FETs.

Figure 2A:
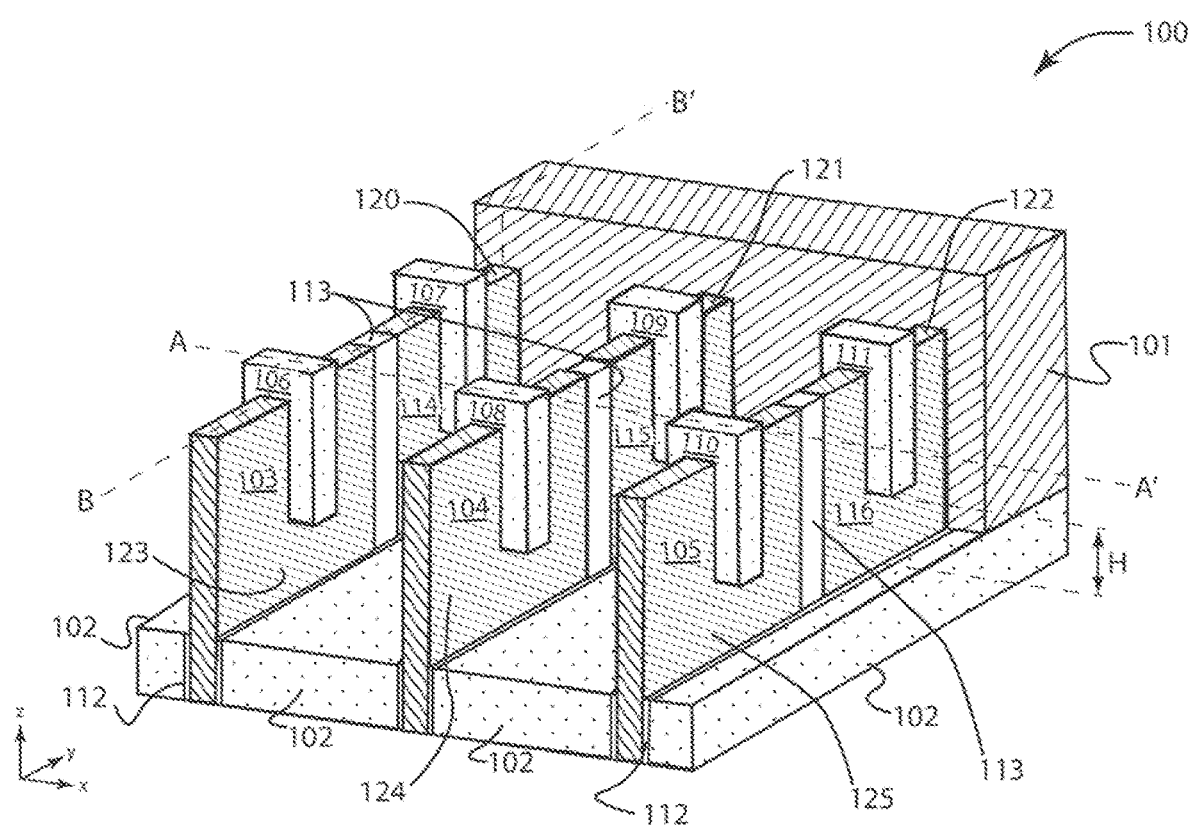
FIG. 2A illustrates an isometric view of the multi-fin transistor device with the isolation dielectric partially removed to reveal top side device structure, in accordance with some embodiments.

FIG. 2A illustrates an isometric view of the multi-fin transistor device 100 shown in FIGS. 1A and 1B, and further revealing the top side device structure, according to some embodiments of the disclosure. In FIG. 2A, only a portion of isolation dielectric 101 is drawn to provide a cutaway view of fins, gate stacks, and metallization structures. In the illustrated embodiment, dielectric liner 112 intervenes between metallization structures 102 and fin sidewall surfaces 123, 124, 125. However, in some alternative embodiments, metallization structures 102 directly contacts fin sidewall surfaces 123-125. FIG. 2A shows plugs 113 between adjacent fin pairs 103,114 and 104,115 and 105,116. Plugs 113 extend from top surfaces 120, 121, 122 down to intersect the plane of metallization structures 102. According to some embodiments, gate stacks 106-111 cover a portion of sidewalls 123-125 and extend to a depth less than that of plugs 113. The portion of fins 103-116 below the depth of gate stacks 106-111 is referred to herein as the subfin. Being below the gated channel, the subfin does not form an active portion of the finFETs. As further shown, metallization structures 102 are separated from gate stacks 106-111 by a subfin height H. As further shown in FIG. 2A, metallization structures 102 extend the length of fins 103-105, extend the length of plugs 113, and extend the length of fins 114-116. Hence, metallization structures 102 may extend the length of any number of fins included in a given column of fins within an integrated circuit.

Figure 2B:
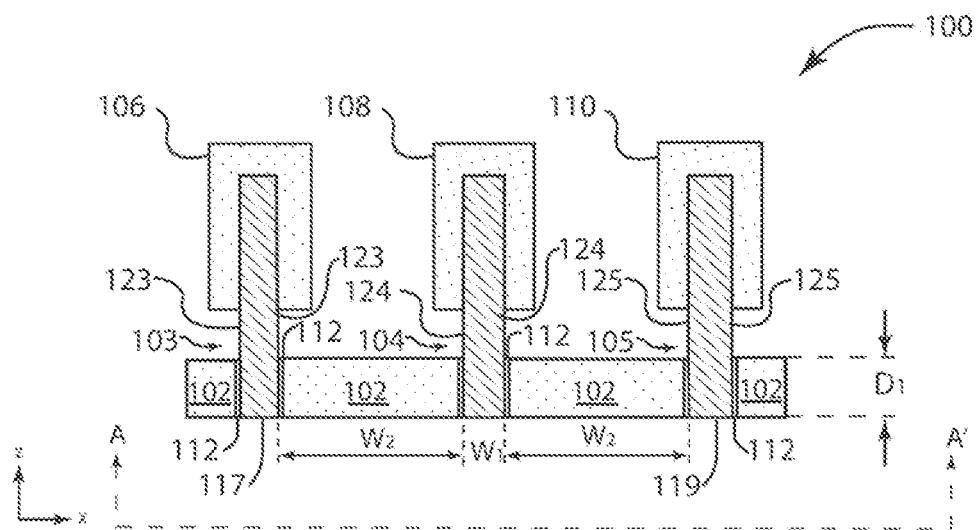
FIG. 2B illustrates a cross-sectional view through adjacent fins of the device shown in FIG. 2A along section line A-A' in accordance with some embodiments.

FIG. 2B is a cross sectional view of multi-fin device 100 taken from cut A-A' in FIG. 2A across fins 103-105. As shown, each fin has a first width $W_1$ defined by sidewalls 123, 124,125, respectively. Fins 103-105 are separated by metallization structures 102, having a second width $W_2$. In some embodiments, liner 112 forms an interface between metallization structures 102 and fin sidewalls 123, 124 and 125. Metallization structures 102 have a thickness $D_1$ in the z-direction that spans the distance from the bottom surfaces 117-119 of fins 103-105, covering a subfin portion of sidewalls 123-125 to a level below gate stacks 106-111. Thickness $D_1$ may therefore vary as a function of fin height minus the gate electrode height. Although not illustrated, metallization structures 102 may be similarly separated vertically (e.g., z-dimension) from source or drain semiconductor, and from source and drain metallization. Alternatively, one or more source or drain semiconductor or source or drain metallization that extends to a depth below that of gate stacks 106-110 (i.e., having a height greater than that of gate stacks 106-110) may directly contact metallization structures 102. As further shown gate stacks 106, 108 and 110, wrap-around top fin surfaces 120-122 and sidewalls 123-125, with the sidewall portion covered by gate stacks 106-111 defining the operative gate height, or channel height (e.g., $H_{Si}$).

Figure 2C:
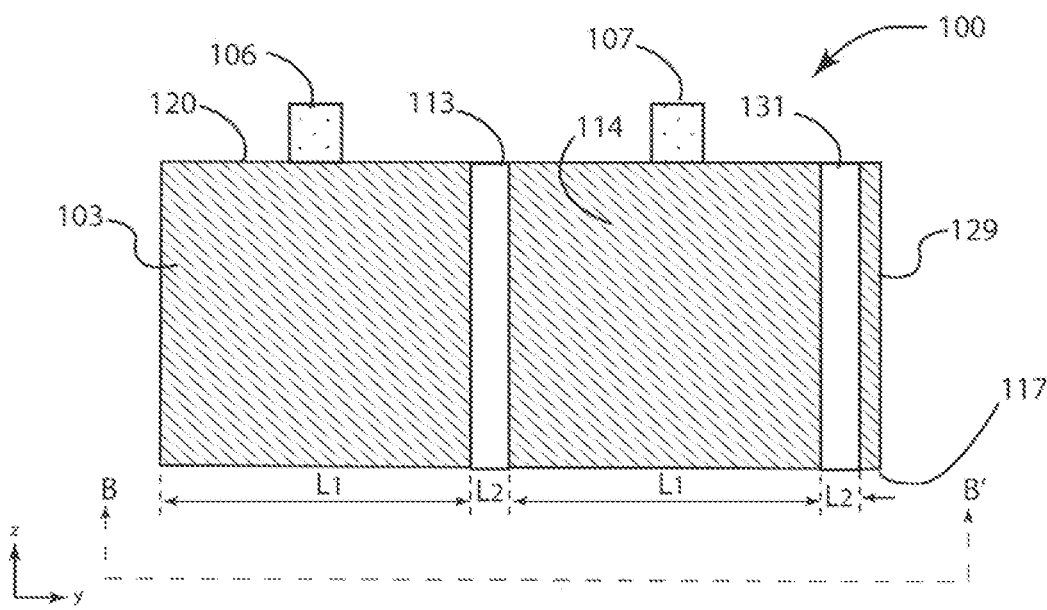
FIG. 2C illustrates a cross-sectional view along the length of a fin of the device shown in FIG. 2A, taken along section line B-B', in accordance with some embodiments.

FIG. 2C is a cross sectional view of fin 103 and accompanying structures, taken from cut B-B' in FIG. 2A along the y-axis and through adjacent fins 103 and 114 separated by plug 113. A third fin 129, shown in partial view, is adjacent to fin 114, separated by plug 131. Although not visible in FIG. 2C, metallization structures 102 run the length (e.g., along y-axis) of all the structures illustrated in FIG. 2C. In the illustrated embodiments, fins 103 and 114 each have a first length $L_1$ separated by a second length $L_2$ of plug 113. The bottom surfaces of fins 103 and 114 therefore each have an area (i.e., footprint) approximately equal to $L_1$ multiplied by $W_1$ ($L_1 \times W_1$). In some embodiments where plug 113 has a width $W_1$ (FIG. 2B), the bottom surface of plug 113 has an area (footprint) approximately equal to $L_2$ multiplied by $W_1$ ($L_2 \times W_1$). As shown, plug 113 completely isolates fin 103 from fin 114. Metallization structures 102 therefore also extend along a sidewall of a portion of plug 113. The length of metallization structures 102 may therefore be equal to the number of fins lengths $L_1$ in a column summed with the number of plug lengths $L_2$. In the truncated view of FIG. 2C, metallization structures 102 span a distance comprising twice $L_1$, corresponding to the length of fins 103 and 114, summed with twice $L_2$, the length (dimension in the y-direction) of plug 113, to reach third fin 129.

Figure 3A:
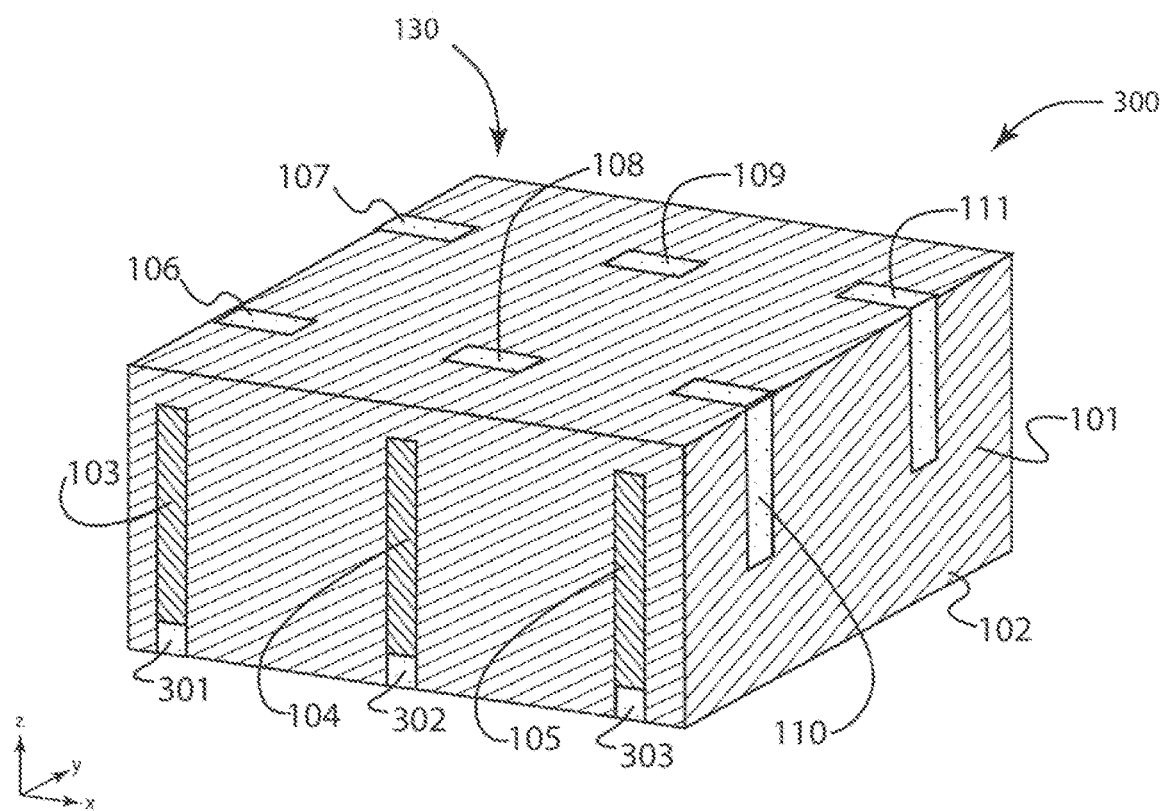
FIG. 3A illustrates a topside isometric view of a multi-fin transistor device layer embedded in an isolation dielectric, in accordance with some embodiments.

FIG. 3A illustrates a topside isometric view of a multi-fin transistor device structure 300 embedded in isolation dielectric layer 101. The isometric view of FIG. 3A and isometric views of subsequent figures of this disclosure will be understood to illustrate only representative portions or truncations of a larger integrated circuit. It is further understood that device layer 300 comprises a plurality of repeating rows of fins and intervening trenches extending along the x axis of the figure. According to embodiments of the disclosure and described in detail below, each fin is associated with individual transistors distributed in an adjacent manner along the y axis of the figure well beyond the extents of the illustration. In some embodiments, other passive or active devices accompany the transistors. In the illustrated embodiment, metallization structures 301, 302, 303 are disposed below, and in-line with, fins 103-105 and embedded in dielectric layer 101, in contrast to metallization structures located between fins. In the illustrated embodiment, metallization structures 301-303 are planar with a bottom surface 130 of isolation dielectric 101. Of course, device 300 is an excerpted structure an any additional dielectrics, metallization levels, packaging, or other known structures may be over or below the illustrated subfin regions. Therefore, metallization structures 301-303 need not be planarized with the bottom surface of a final operative device. Top surfaces of gate stacks 106, 107, 108, 109, 110, 111 are also visible in FIG. 3A.

Figure 3B:
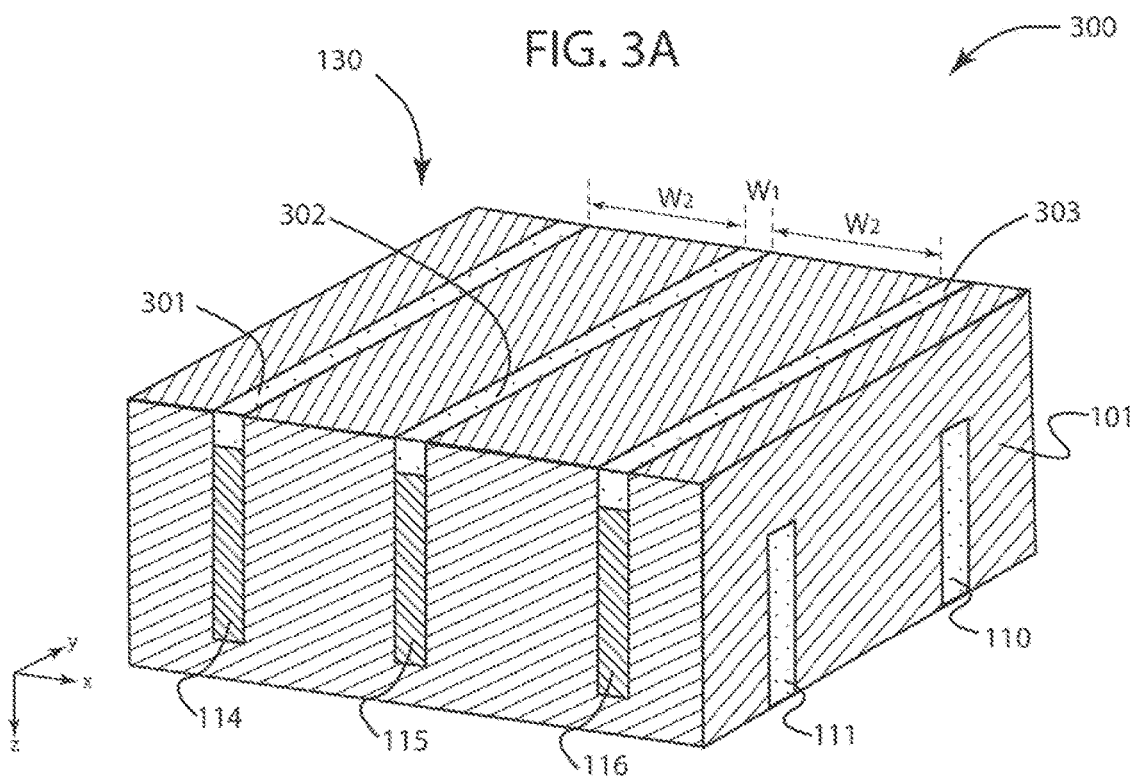
FIG. 3B illustrates an inverted isometric view of the device shown in FIG. 3A, revealing metallization structures on the bottom along recesses formed under the fins and between trenches, in accordance with some embodiments.

FIG. 3B illustrates an inverted isometric view of device structure 300, revealing bottom surfaces of metallization structures 301-303 under the bottoms of fins, according to some embodiments of the disclosure. Metallization structures 301-303 may provide thermal and/or electrical conduction paths on the backside of device structure 300. As shown, subfin portions of fins 114-116 are recessed into dielectric 101 and covered by metallization structures 301-303, respectively. In the illustrated embodiment, metallization structures 301-303 each have a width $W_1$ equal to that of fins 114-116. Metallization structures 301-303 have lengths that cover the entire bottom of at least fins 114-116, and in the illustrated embodiment further cover the entire bottom of multiple fins in a column of fins and the intervening plugs. Adjacent metallization structures (e.g., metallization structures 301 and 302) are separated by isolation 101. Isolation 101 also separates fins 103-105. Isolation 101 between adjacent metallization and adjacent fins has a width $W_2$. In some further embodiments, a dielectric liner (not depicted) is between metallization structures and semiconductor fins, for example to provide electrical isolation between the fin and metallization structures, and/or to provide an interdiffusion barrier between the fin and metallization structures. In some embodiments, $W_1$ an $W_2$ have more than one value, and multiple fin spacing and fin widths on a single die. For example, a device may have multiple fin pitches and widths within one die, with some region of the die having a $W_1$ and $W_2$ of one value, and another region with $W_1'$ and $W_2'$ of another value.

Figure 4A:
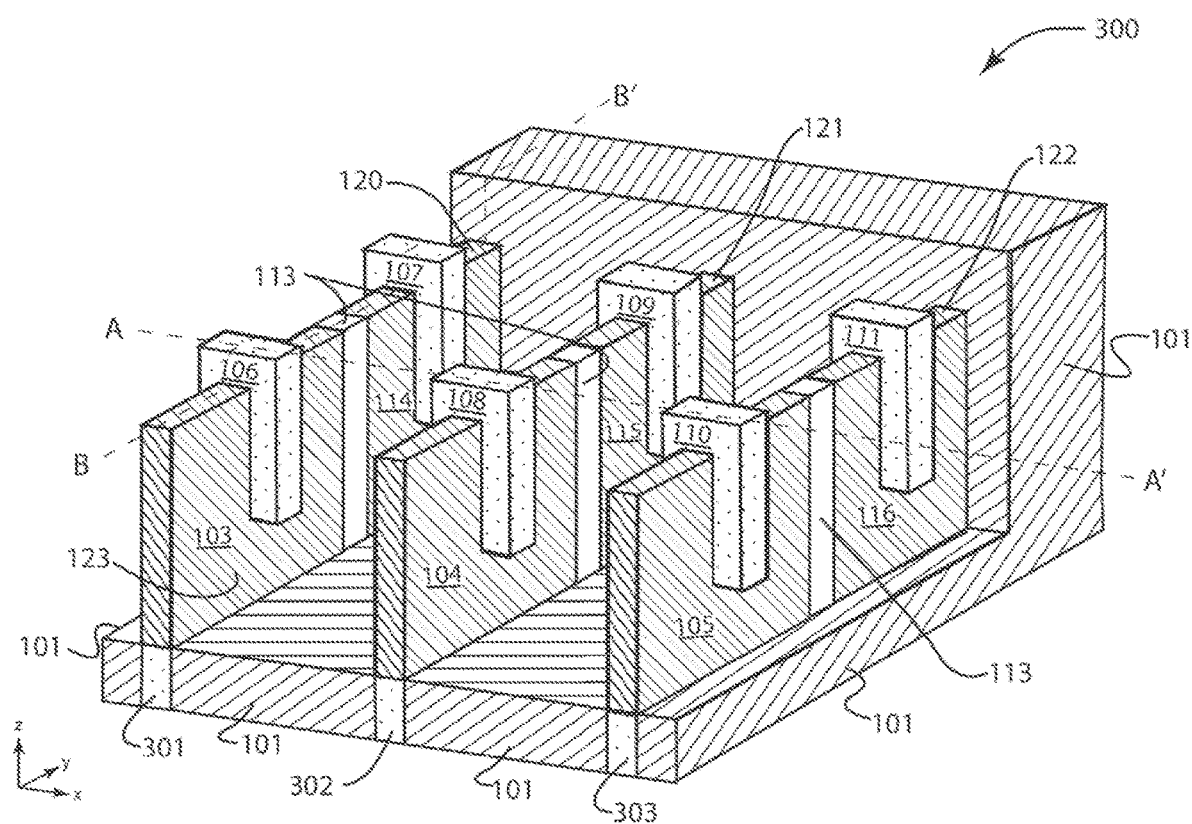
FIG. 4A illustrates an isometric view of the multi-fin transistor device with the isolation dielectric partially removed to reveal top side device structure, in accordance with some embodiments.

FIG. 4A illustrates an isometric view of device structure 300 with additional portions the top side device structure revealed, according to some embodiments. Adjacent fins 103 and 114, 104 and 115, 105 and 116 form three columns of fins. In alignment with the columns are metallization structures 301-303. With the exemplary fins being lines, metallization structures 301-303 are also linear (i.e., lines). Adjacent metallization structures 301-303 are separated by structural portions of isolation 101 that also extend between columns of fins. In the illustrated embodiment, isolation 101 abuts metallization structures 301-303. Adjacent fins 103 and 114, 104 and 115, 105 and 116 are separated by plugs 113, extending from top surfaces 120-122 down to a bottom surface that separates metallization structures 301-303 and the base of the fins.

As further shown in FIG. 4A, gate stacks 106-111 wrap over top fin surfaces 120-122 and fin sidewalls 123-125 separating source and drain regions of transistors. Metallization structures 301-303 may conduct current (e.g., electrical signals and/or power to and from transistors or other devices formed on fin segments). Metallization structures 301-303 may also conduct heat from transistors or other devices formed on fin segments). In some embodiments, metallization structures 301-303 are placed between two layers of semiconductor fins, for example in a vertical stacking of devices for 3D monolithic integration.

Figure 4B:
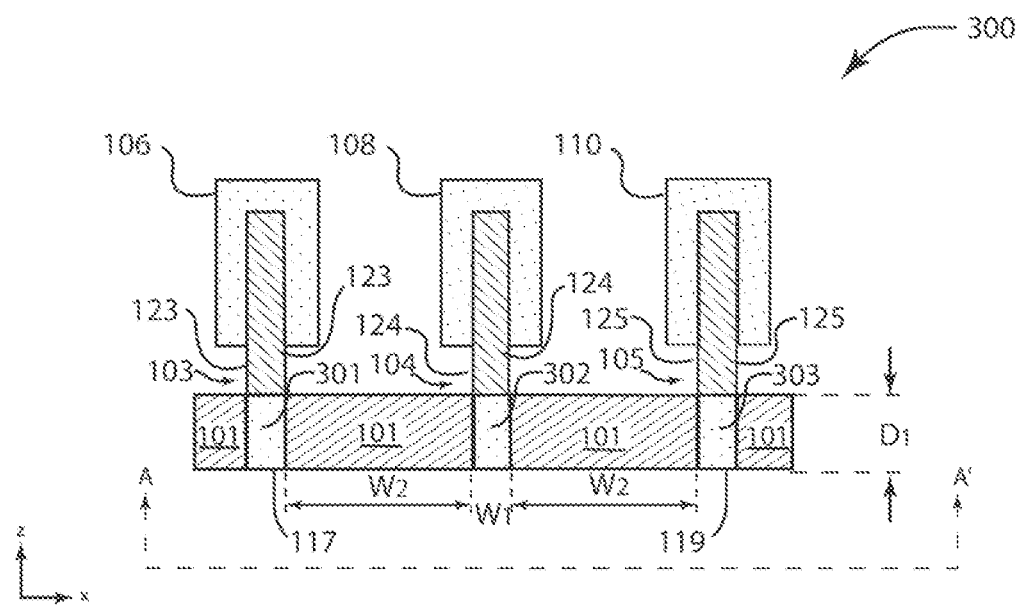
FIG. 4B illustrates a cross-sectional view through adjacent fins of the device shown in FIG. 4A along section line A-A', in accordance with some embodiments.

FIG. 4B is a cross sectional view of multi-fin transistor device 300 taken from cut A-A' in FIG. 4A across fins 103-105. As shown, each fin has a first width $W_1$ bounded by sidewalls 123-125, respectively. Metallization structures 301-303 are directly below fins 103-105 and are separated from each other by intervening structures of isolation 101 having a second width $W_2$. Thus, adjacent isolation structures are separated by $W_1$, the width of fin 103 and dielectric plug 113. Metallization structures 301-303 have a thickness $D_2$ that extends along the z-axis from the bottom surfaces of fins 103-105, covering a subfin portion of sidewalls 123-125 to a level below gate stacks 106-110. Thickness $D_2$ may therefore vary as a function of fin height minus the gate electrode height. Although not illustrated, metallization structures 301-303 may be similarly separated vertically (e.g., z-dimension) form source or drain semiconductor, and from source and drain metallization. Alternatively, one or more source or drain semiconductor or source or drain metallization that extends to a depth below that of gate stacks 106-110 (i.e., having a height greater than that of gate stacks 106-111) may directly contact metallization structures 301-303. As further shown gate stacks 106, 108 and 110, wrap-around top fin surfaces 120-122 and sidewalls 123-125, with the sidewall portion covered by gate stacks 106-110 defining the operative gate height, or channel height (e.g., $H_{si}$). While FIG. 4B shows that metallization structures 301-303 have the same width $W_1$ of fins 103-105, in some embodiments metallization structures 301-303 are wider than fins 103-105. Regardless, metallization structures 301-303 will have a longitudinal centerline or axis that is in vertical alignment (i.e., overlaps) a longitudinal centerline of first 103-105.

Figure 4C:
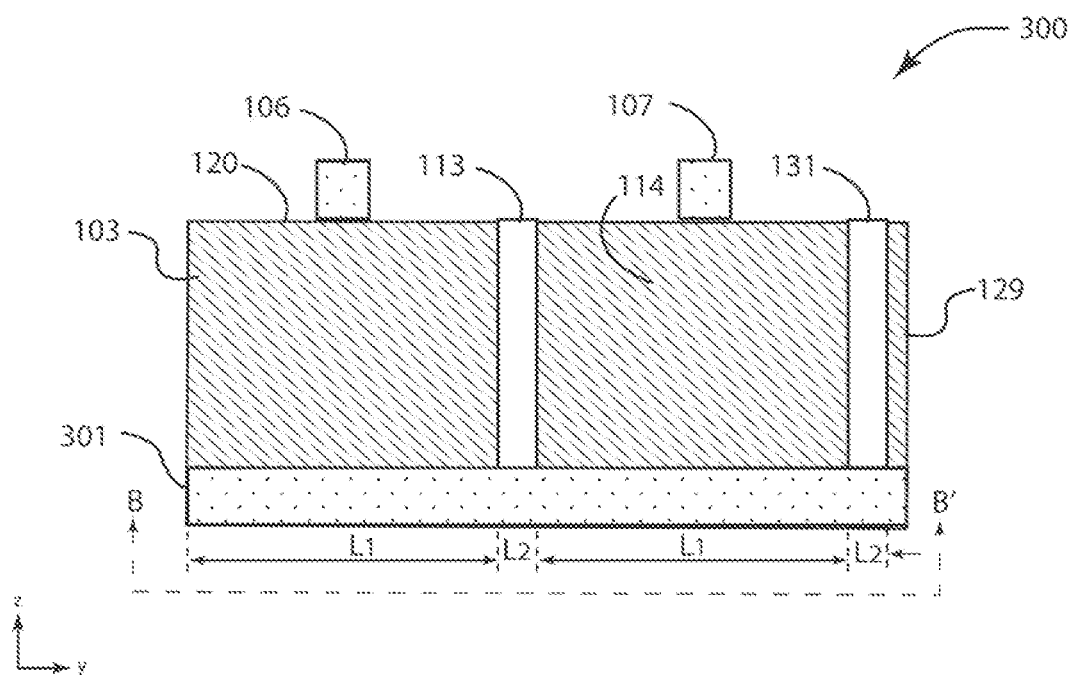
FIG. 4C illustrates a cross-sectional view along the length of a fin of the device shown in FIG. 4A, taken along section line B-B', in accordance with some embodiments.

FIG. 4C is a cross sectional view of device structure 300, taken from cut B-B' in FIG. 4A along the length of fins 103 and 114, along a length of plug 113. In the illustrated embodiments, fins 103 and 114 each have a first length $L_1$ separated by a second length $L_2$ of plug 113. The bottom surfaces of fins 103 and 114 therefore each have an area (i.e., footprint) approximately equal to $L_1$ multiplied by $W_1$ ($L_1 \times W_1$). In some embodiments where plug 113 has a width $W_1$ (FIG. 2B), the bottom surface of plug 113 has an area (footprint) approximately equal to $L_2$ multiplied by $W_1$ ($L_2 \times W_1$). As shown, plug 113 completely isolates fin 103 from fin 114. Metallization structure 301 therefore also extends along a sidewall of a portion of plug 113. As shown in FIG. 4C, metallization structure 301 is directly below fin 103 and runs the length (e.g., along y-axis) of all the fin and plug structures illustrated in FIG. 2C. Metallization structure 301 may also extend along only a portion of the length of the fin column comprising fins 103, 114 and 129. In the illustrated embodiment, metallization structure 301 is in intimate contact with fins 103,114. In some embodiments, the length of conductor line 301 is contiguous along an entire column of fins extending in the y-direction with the length of the metallization structure being equal to the number of fins lengths $L_1$ in the column summed with the number of plug lengths $L_2$. In the truncated view of FIG. 4C, metallization structure 301 spans a distance comprising twice $L_1$, corresponding to the length of fins 103 and 114, summed with twice $L_2$, the length (dimension in the y-direction) of plug 113, to reach third fin 129. In another embodiment, the plug 113 may extend to the bottom of the metallization region, thereby separating metallization region 301 into two separate metallization regions on either side of plug 113.

Figure 5:
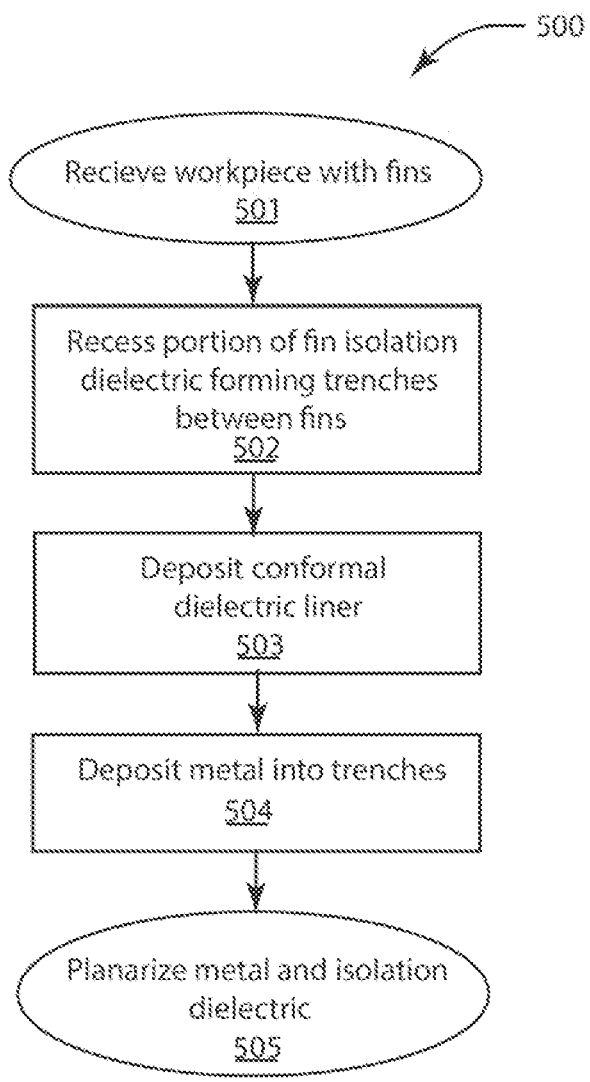
FIG. 5 illustrates a flow diagram of an exemplary method of forming metallization structures within recessed trenches formed within the isolation dielectric between subfins of a multi-fin transistor device layer, in accordance with some embodiments.

FIG. 5 illustrates a flow diagram of an exemplary method 500 for forming metal structures between fins of a multi-fin transistor device layer, in accordance with some embodiments. Method 500 begins with operation 501, receiving a workpiece, which may include any of the substrate materials described above. The workpiece, as received, may include a multi-fin device structure according to one or more of the embodiments described above and depicted in FIGS. 1A, 1B, 3A and 3B, and/or integrated circuits comprising one or more multi-fin device structures on one side of the semiconductor substrate. In addition, the opposite side of the semiconductor substrate has been removed to reveal the bottoms of the fins and intervening isolation dielectric. As received, the multi-fin device structure may be bonded to a carrier wafer for mechanical support. In operation 502, the isolation dielectric between the fins are recessed, forming trenches that expose a subfin portion of the fins. In some embodiments, preferential removal of the isolation dielectric may be accomplished by a selective etch of the dielectric in preference to the semiconductor material. The isolation dielectric may be partially removed by a plasma etch and/or wet etch process. Trenches formed at operation 502 expose fin sidewalls, and may obtain a depth specified such that the bottom of the trenches maintains a specified distance below the gate stacks and metallization formed on the fin sidewalls. The etch depth may be controlled by controlling selective etches having known etch rates of the isolation dielectric. The etch process may form trenches having a predetermined depth, corresponding to a desired thickness of the metallization structures that are to be formed within the trenches. For example, an etch depth may be predetermined to accommodate a metallization thickness $D_1$ depicted in FIG. 2B). The recessed trenches span the width of the isolation dielectric stripe (e.g., width $W_2$ shown in FIG. 2B). At operation 503, a liner layer is deposited into the recessed trenches and onto the adjacent surface. The dielectric liner material may comprise compositions including, but not limited to, oxides of silicon, silicon nitrides, silicon oxynitride, SiOC(H), MSQ, HSQ, porous dielectrics, etc. The liner may be deposited by methods including, but not limited to, RF and DC sputtering, evaporation, chemical vapor deposition (CVD)

methods such as PECVD and LPCVD, atomic layer deposition (ALD), and liquid phase deposition methods. Notably, operation 503 is optional as a liner may not be needed or even desirable in some implementations of method 500. In some embodiments, the thickness of the dielectric liner is less on the more vertical sides of the recessed trenches than it is on the bottom of the recessed trenches (i.e., non-conformal). In other embodiments, the thickness of the dielectric liner on the more vertical sides of the recessed trenches is substantially the same as the thickness on the bottom of the recessed trenches (i.e., conformal).

At operation 504, metallization structures are formed. In some embodiments, copper (and alloys thereof), or aluminum (and alloys thereof) are deposited at operation 504. Other metals such as, but not limited to, gold, silver, cobalt, tantalum, titanium, or tungsten, may be also be deposited. Other conductive materials having an electrical and/or thermal conductivity that is significantly higher than that of the fin material (e.g., graphite or graphene) might instead be deposited in place of a true metal.

Deposition may be by a variety of methods, including, but not limited to, evaporation, RF and DC sputtering, chemical vapor deposition techniques such as PECVD, LPCVD, or ALD, and plating techniques (e.g., electroless or electrolytic deposition). In some embodiments where electrochemical plating is employed, a seed layer of a metal such as copper may be deposited by sputtering or evaporation on the backside after the trench etch to provide a conformal conductive plating surface. Regardless of the specific deposition technique, the resulting metallization structures are self-aligned with the fin pattern (i.e., no lithographic patterning or masking steps needed).

At operation 505, the metallization is planarized, for example to remove any overburden or achieved a desired metallization thickness specification. In some embodiments, the planarization comprises a chemical-mechanical polish (CMP).

Figure 6A:
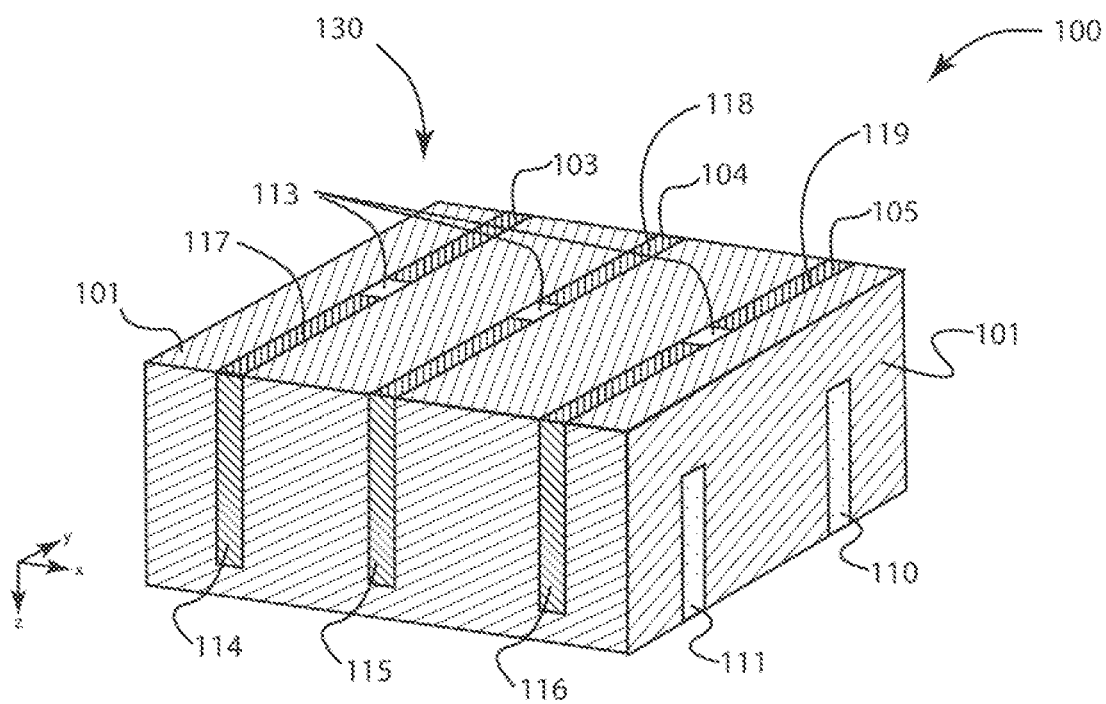
FIGS. 6A-D illustrate isometric views of a multi-fin transistor device evolving as selected operations in the exemplary method illustrated in FIG. 5 are performed, in accordance with some embodiments.

FIGS. 6A-D illustrate a sequence of isometric views of a multi-fin transistor device 100 evolving as selected operations in method 500 are performed, in accordance with some embodiments. FIG. 6A shows an isometric view of a received workpiece, comprising multi-fin transistor device structure 100. The structure is inverted to present the bottom surface 130 of the device for processing. In FIG. 6A, a bottom 117-119 of fins 103-105 and 114-116 are shown, as well as a bottom plugs 113.

Figure 6B:
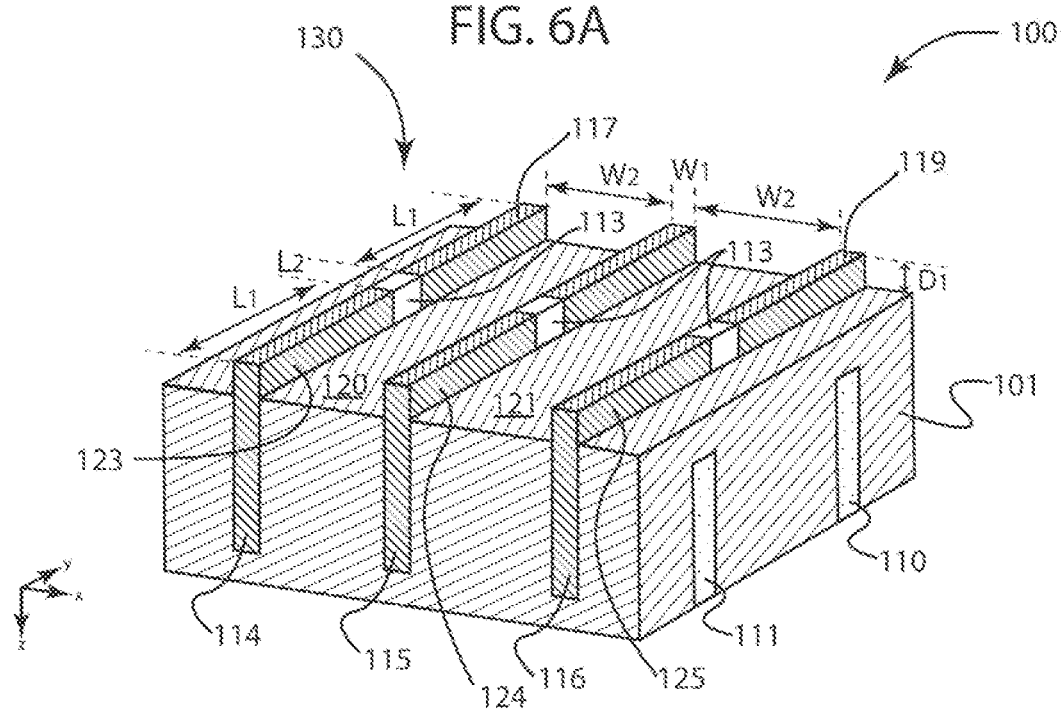
Figure 6C:
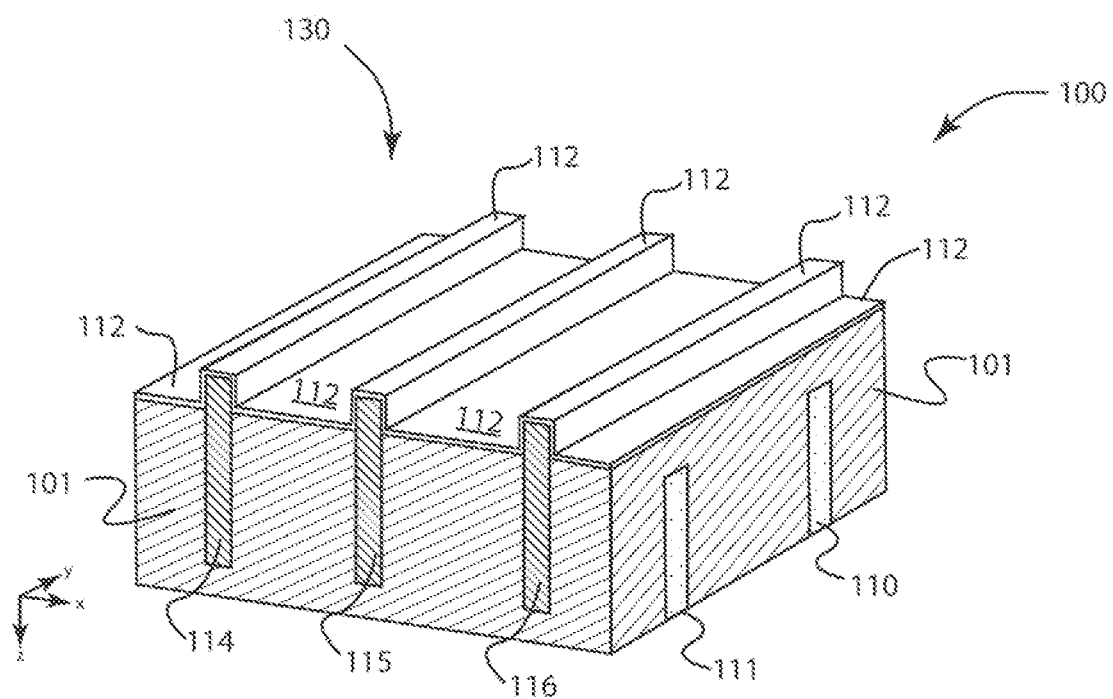

In FIG. 6B, isolation dielectric 101 has been recessed, forming trenches having a depth $D_1$, between fins 103, 104 and 105, and fins 114, 115 and 116 revealing bottom portions of fin sidewalls 123-125 and sidewalls of plugs 113. Fin width $W_1$ separates recessed sections of isolation dielectric 101, whereas fin sidewalls 123-125 are separated from one another by trench width $W_2$. In FIG. 6C, a dielectric liner 112 is deposited (conformally or non-conformally) over exposed fin surfaces and in the trenches or recesses between fins, according to some embodiments. Dielectric liner 112 may be deposited to a thickness ranging from 1-100 nm, for example. In some embodiments, dielectric liner is 2-3 nm thick.

Figure 6D:
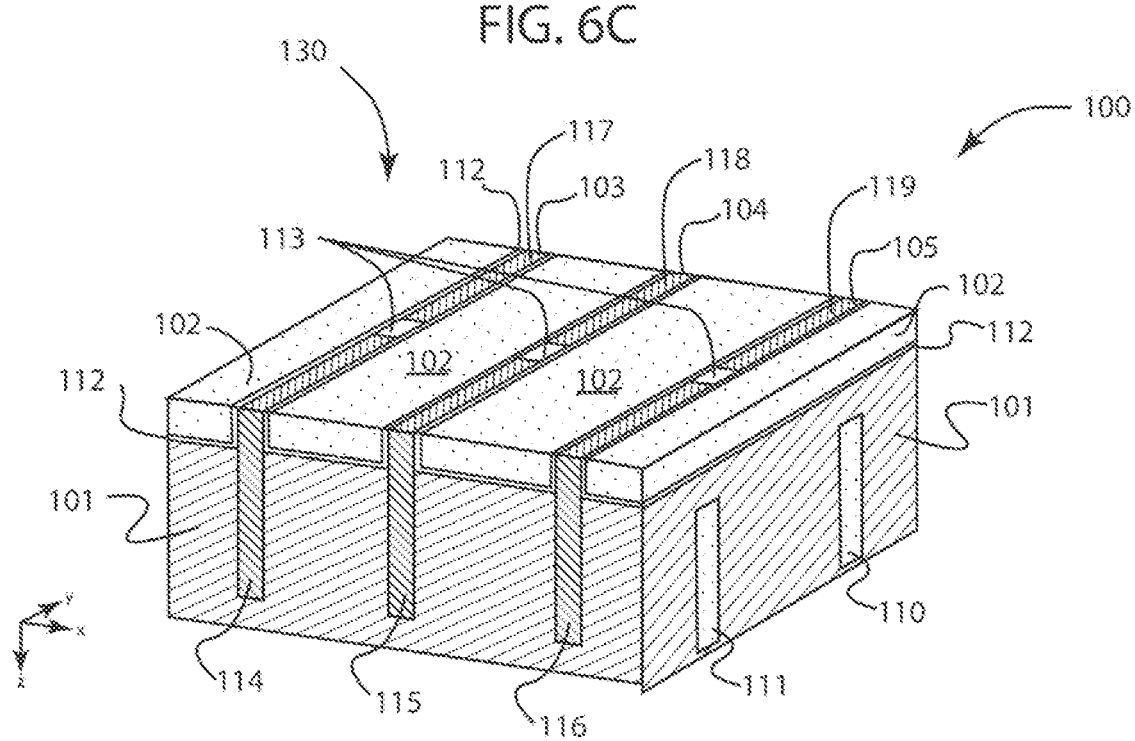

In FIG. 6D, a metal layer has been deposited over dielectric liner 112. During metal deposition, fin bottom surfaces 117-119 are covered in layer of the deposited metal contiguous with adjacent metallization structures 102 back-filling the trenches or recesses. Bottom surface 130 has been planarized to remove metal from over fin bottom surfaces 117-119, separating metal structure 102 by the fin width $W_1$. Planarization may be carried out by CMP methods, for example. Sputtering, as well as plasma and wet etching methods may also be employed. Following planarization, metallization structures 102 are planar with fin bottom surfaces 117-119, resulting in multi-fin transistor device 100 as shown in FIGS. 1A-2C.

Figure 7:
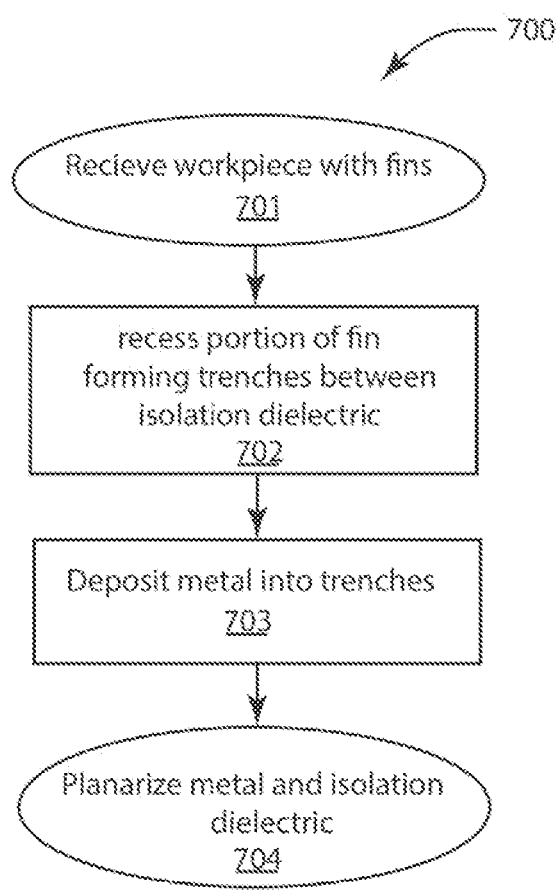
FIG. 7 illustrates a flow diagram of an exemplary method of forming metallization structures within recesses formed directly under subfins between isolation dielectric of a multi-fin transistor device layer, in accordance with some embodiments.

FIG. 7 illustrates a flow diagram of an exemplary method 700 of forming bottom-side metal structures within recesses formed directly under fins between isolation dielectric of a multi-fin transistor device structure, in accordance with some embodiments. At operation 701, a semiconductor workpiece is received. The workpiece, may for example include a bulk or semiconductor-on-insulator (SOI) substrate. The workpiece may include a multi-fin device structure according to the embodiments described above and depicted in FIGS. 3A and 3B and/or integrated circuits comprising one or more multi-fin devices on one side of the semiconductor substrate. In addition, the opposite side of the semiconductor substrate has been removed to reveal the bottom of the device structure, where the semiconductor subfins and intervening isolation dielectric are exposed. The received workpiece may be bonded to a carrier wafer for mechanical support At operation 702, a selective etch has been carried out on the exposed semiconductor material to recess the bottom of fins, forming subfin trenches directly under the fins, between the isolation dielectric flanking the sidewalls of the fins. The semiconductor fins may be etched to any predetermined depth (e.g., corresponding to thickness $D_2$ in FIG. 4B). The depth may be less than the difference between the fin height and the gate stack height, for example. Any suitable preferential etching methods may be used. These include, but are not limited to, wet etching (e.g., KOH), or plasma etching. Optionally, the plugs of dielectric material that separate adjacent fins may also be removed during the etch of the fins. Optionally, a dielectric liner may be deposited or grown in the subfin trenches in an operation preceding operation 703 (not shown).

At operation 703, metal or other conductive material is deposited into the trenches and over the isolation dielectric flanking the sidewalls of the fins. Examples of metals and other conductors are described above for method 500, any of which may be deposited by the same techniques provided above in the description of method 500. At operation 704, overburden on the backside surface is removed by a planarization step, for example with any suitable CMP process. The resulting metallization structures follow the fin layout of the device and are self-aligned with the fin pattern (i.e., no lithographic patterning or masking steps needed).

Figure 8A:
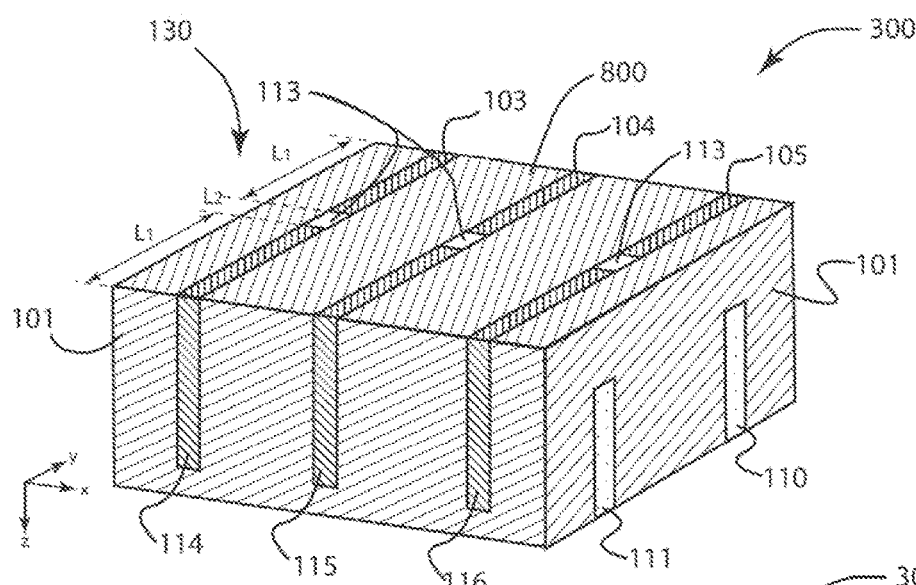
FIG. 8A-C illustrate isometric views of a multi-fin transistor device evolving as selected operations in the exemplary method illustrated in FIG. 7 are performed, in accordance with some embodiments.
Figure 8B:
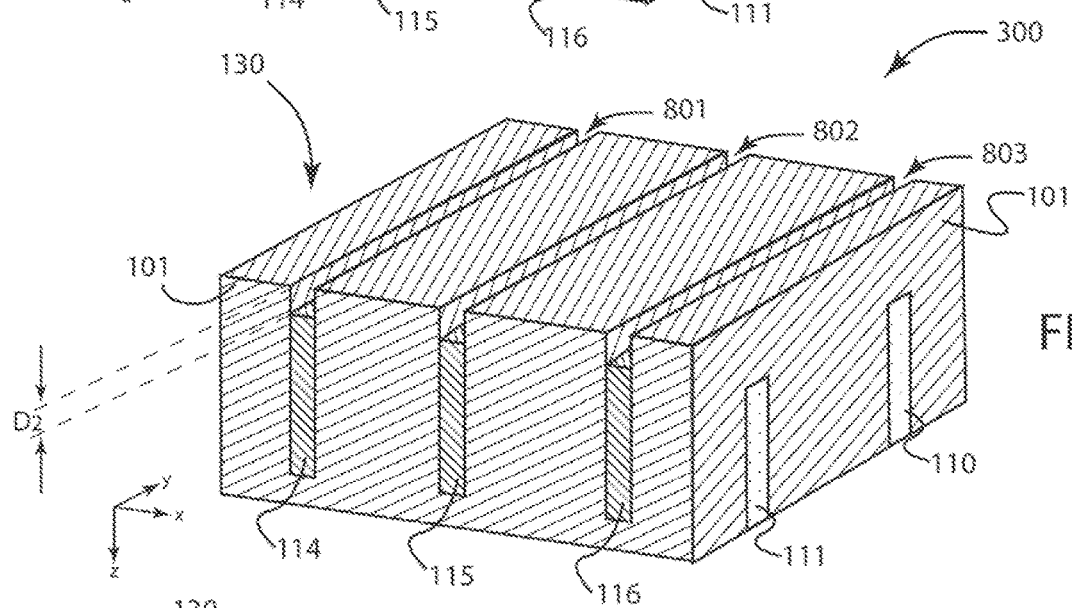
Figure 8C:
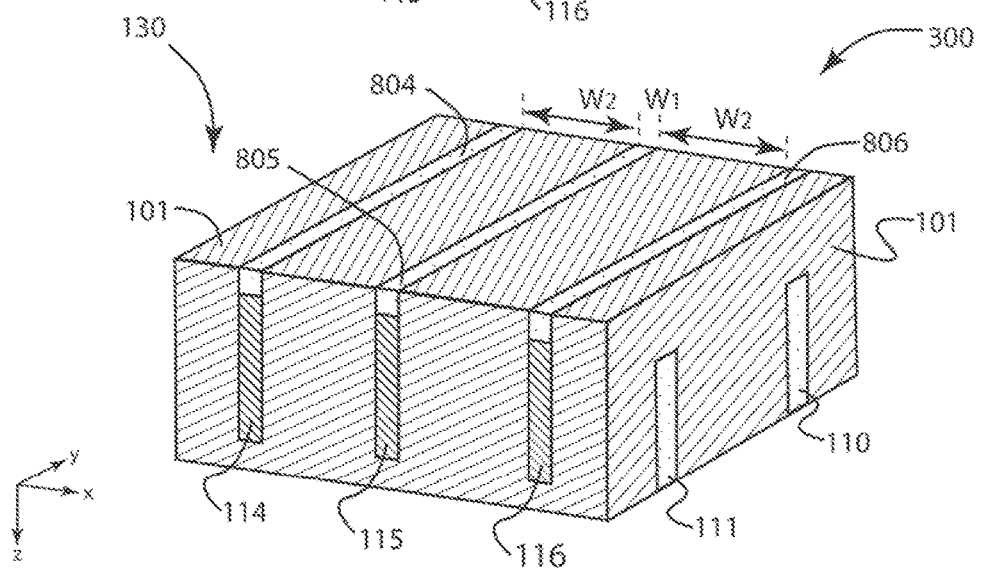

FIG. 8A-C illustrate sequence of isometric views of a multi-fin transistor device evolving as selected operations in the exemplary method illustrated in FIG. 7 are performed, in accordance with some embodiments. FIG. 8A shows an isometric view of a received workpiece, comprising a multi-fin transistor device structure 300. The structure is inverted to present the bottom surface 130 of the structure for processing. In FIG. 8A, bottom surfaces 117-119 of fins 103-105 and 114-116 are revealed, as well as a bottom surface of plugs 113. Surfaces of gate stacks 110 and 111 are also visible. In some embodiments, multi-fin transistor structure 300 is bonded to a carrier substrate (not depicted).

In FIG. 8B, trenches 801-803 have been formed by recessing the fins. Trenches 801-803 have a width that is substantially equal to fin width $W_1$, which separates sections of isolation dielectric 101 in some embodiments. The fin column comprising fins 114-116 (and adjacent fins 103-104, not shown), as well as plugs 113, are recessed to form trenches having a depth $D_2$ below surface 130, corresponding to metal structure thickness $D_2$ in FIG. 4B. Depth $D_2$ may be chosen to avoid interference with gate stacks and metal structures on the sidewalls of the fins. Depth $D_2$ may be less than the difference between the fin height and the gate stack height. Trench formation may be performed by several methods, for example as described in operation 702 of method 700. Optionally, a dielectric liner may be deposited in trenches 801-803 preceding formation of metallization structures.

In FIG. 8C, a metal (or other conductive material) is deposited over surface 800, at least partially filling the trenches to form subfin metallization structures 804-806. As described for method 500, the metal may be deposited by a variety of methods, including, but not limited to, evaporation, RF and DC sputtering, chemical vapor deposition techniques such as PECVD and LPCVD, electroless deposition, and electroplating, for example as explained above in the description of process flow 500.

Bottom surface 130 may be covered in layer of the deposited metal contiguous with adjacent metal structures 804-806. In FIG. 8C, bottom surface 130 has been planarized to remove metal from over fin bottoms 117-119, separating metallization structures 804-806 by $W_2$, the width of isolation between fins. Planarization may be any suitable technique. As a result of the planarization, metallization structures 804-806 are planar with bottom surface 130, producing multi-fin transistor device structure 300 as shown in FIGS. 3A-4C.

Figure 9:
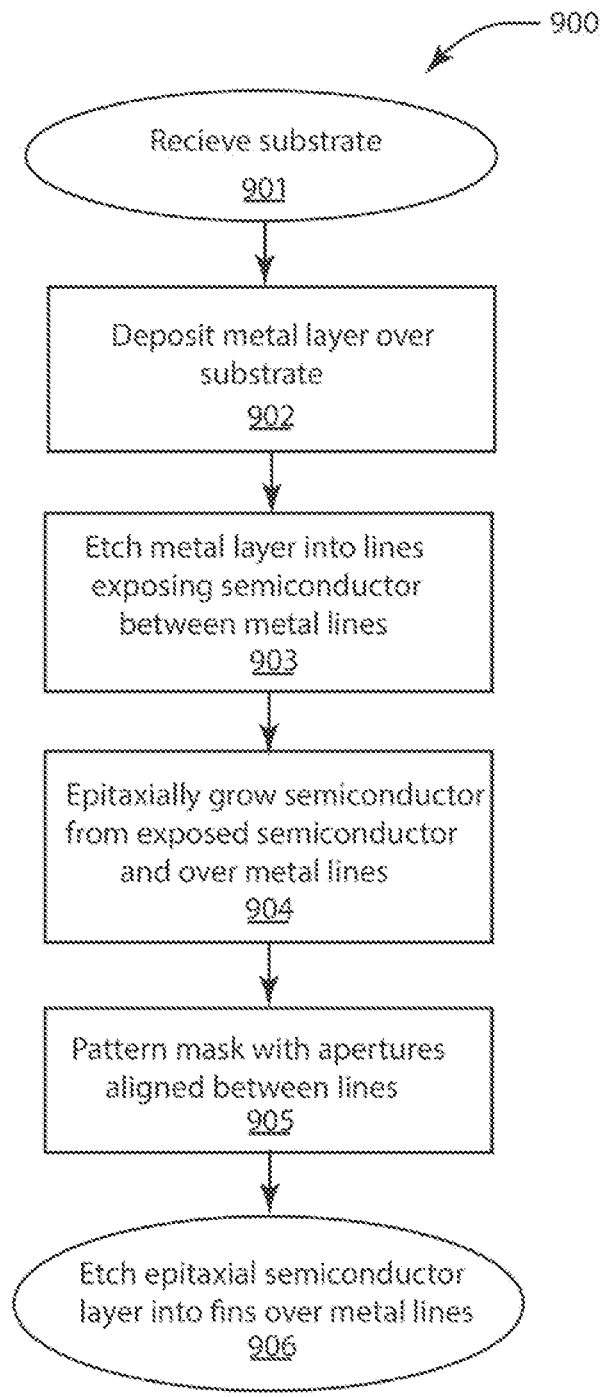
FIG. 9 illustrates a flow diagram of an exemplary method of forming fins in an epitaxial semiconductor layer grown over metallization structures first formed on the semiconductor substrate, in accordance with some embodiments.

FIG. 9 illustrates a flow diagram of a method 900 for forming fins over metallization structure from an epitaxial semiconductor layer grown over the semiconductor substrate. At operation 901, a substrate including any of the semiconductor materials described elsewhere herein is received. In some embodiments, the semiconductor substrate is unprocessed. In some embodiments, the semiconductor substrate has structures fabricated on at least one side. In some embodiments, prior processing includes deposition of a metallization layer, and masking the metallization layer in preparation of a patterned etch of the metallization layer. The metallization layer may comprise any of the metals or other conductive materials described elsewhere herein for metallization structures. Alternatively, at operation 902, a metallization layer is deposited on the substrate surface. A metal or non-metal conductor may be deposited. Examples of metals and non-metal conductors include copper or alloys of copper. In some other embodiments, the metallization layer deposited is aluminum or an alloy of aluminum. In some other embodiments, the metallization layer deposited comprises at least one of tungsten, titanium, or tantalum. Other metals are also possible (e.g., gold, silver, cobalt, etc.). Exemplary conductors include semimetals such as, but not limited to, graphite and graphene. The metallization layer may be deposited by a suitable technique such as, but not limited to, sputtering (DC and RF), evaporation, PECVD, LPCVD, electroless deposition, and electroplating. In some embodiments, the metal layer may be deposited to thicknesses ranging from 10-100 nm.

At operation 903, metallization structures are etched in the metal layer deposited on the semiconductor substrate surface and masked in a previous operation (as in 901). In some embodiments, the metallization structures are lines isolated from one another and with a semiconductor substrate surface between adjacent lines. In some embodiments, the etch process may utilize wet etch methods, such as, but not limited to, acid etch, iodine etch, cyanide etch, etc. Alternatively, dry (plasma) etching techniques may be employed. In some embodiments, the metal lines have a fixed width. In other embodiments, the metal lines have different widths. In some embodiments, the metal line widths are substantially the same as the widths of fins that are to be formed in a subsequent operation of method 900.

According to embodiments, at operation 904, an epitaxial semiconductor layer is grown from the exposed semiconductor material of the semiconductor substrate, and over the metallization structures. In some embodiments, the epitaxial semiconductor layer is seeded in the trenches and grows laterally over the metallization structures. In some embodiments, the epitaxial semiconductor material is one of a group IV material such as silicon, germanium or silicon-germanium alloy, a III-V compound, such as gallium arsenide indium phosphide, indium arsenide, a III-N material such as gallium nitride, or a II-VI compound, such as cadmium telluride, etc. In some embodiments, the epitaxial semiconductor material has the same crystallinity as the substrate material. The thickness of the epitaxial semiconductor layer is a function of growth kinetics associated with the epitaxial process, and the growth may be timed based on known growth rates to define a layer thickness. In some embodiments, the thickness of the epitaxial layer corresponds to the height of the fins that are to be fabricated in the subsequent operation.

At operation 905, the etch mask is applied to the epitaxial semiconductor layer. In some embodiments, the etch mask has apertures aligned over trenches between metal lines. In some embodiments, the apertures have widths that are the same as the trench widths. In other embodiments, the apertures have widths that are different from the trench widths (e.g., smaller or larger). At operation 906, the epitaxial semiconductor layer is etched, for example to expose the substrate between the metal lines, forming fins on the metal lines. The etch process may employ wet etch and/or plasma etch methods.

Figure 10A:
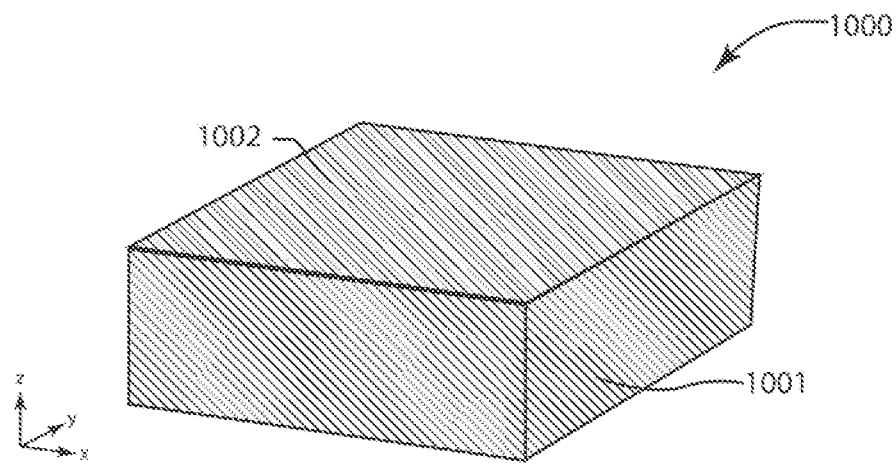
FIGS. 10A-F illustrate a sequence of isometric views of the evolution of fin fabrication from an epitaxial semiconductor layer, as selected operations of the exemplary method illustrated in FIG. 9 are performed, in accordance with some embodiments.

FIGS. 10A-F illustrate a sequence of isometric views depicting the evolution of a semiconductor fin structure 1000 by epitaxial fin fabrication directly on metal lines, as selected operations of method 900 are performed. In FIG. 10A, semiconductor substrate 1001 is prepared for deposition of a metal layer 1003 on surface 1002. In some embodiments, metal layer 1003 is any of copper, aluminum, titanium, tantalum, tungsten, and alloys thereof. In some embodiments, a semimetal such as, but not limited to, graphite, graphene is deposited. In some embodiments, semiconductor substrate 1001 is unprocessed on at least one surface 1002. In some embodiments, semiconductor substrate 1001 has structures on both surfaces.

Figure 10B:
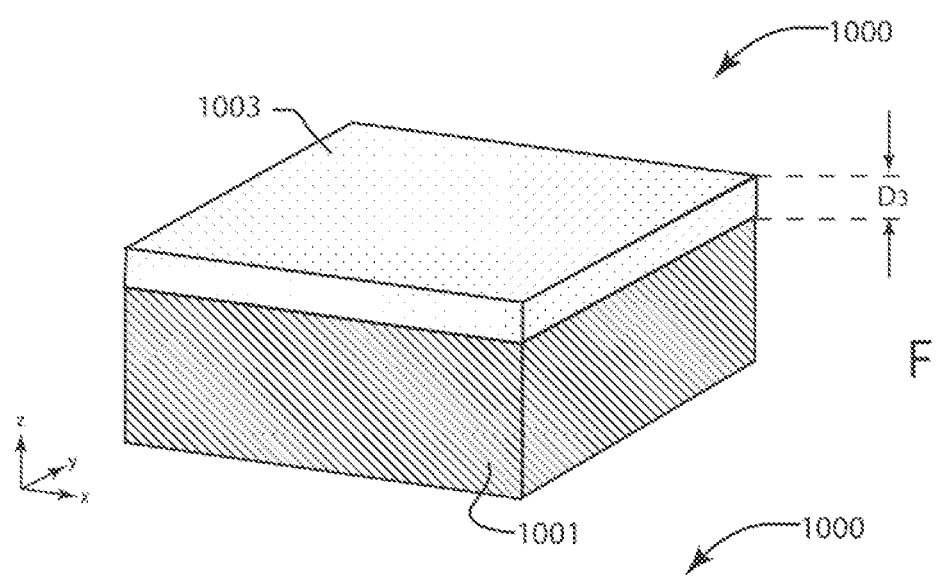
Figure 10C:
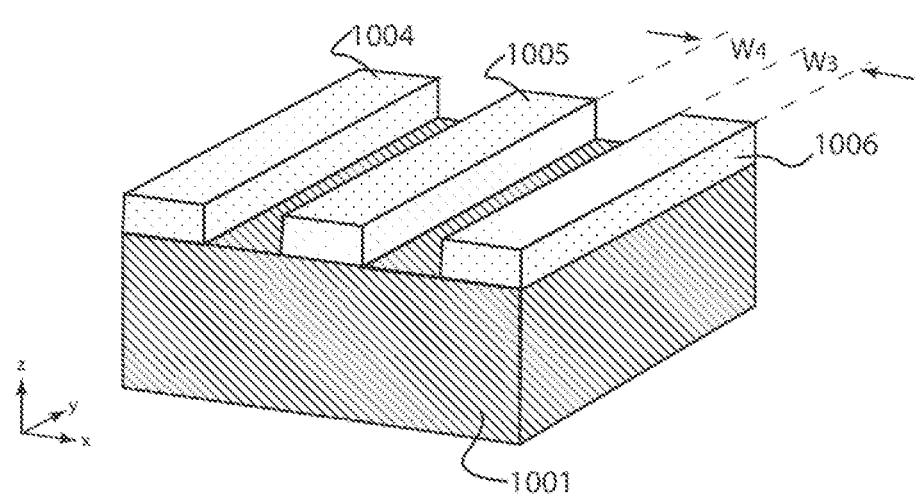

In FIG. 10B, metal layer 1003 has been deposited on surface 1002 to a thickness $D_3$. In FIG. 10C, metal layer 1003 is patterned into metallization structures 1004-1006 (e.g., lines separated by spaces). For example, metal layer 1003 may be first masked with apertures in the mask to define the metallization structure. In some embodiments, metallization structures 1004-1006 have a width $W_3$, separated by trench width $W_4$. In some embodiments, metallization structures 1004-1006 have different widths.

Figure 10D:
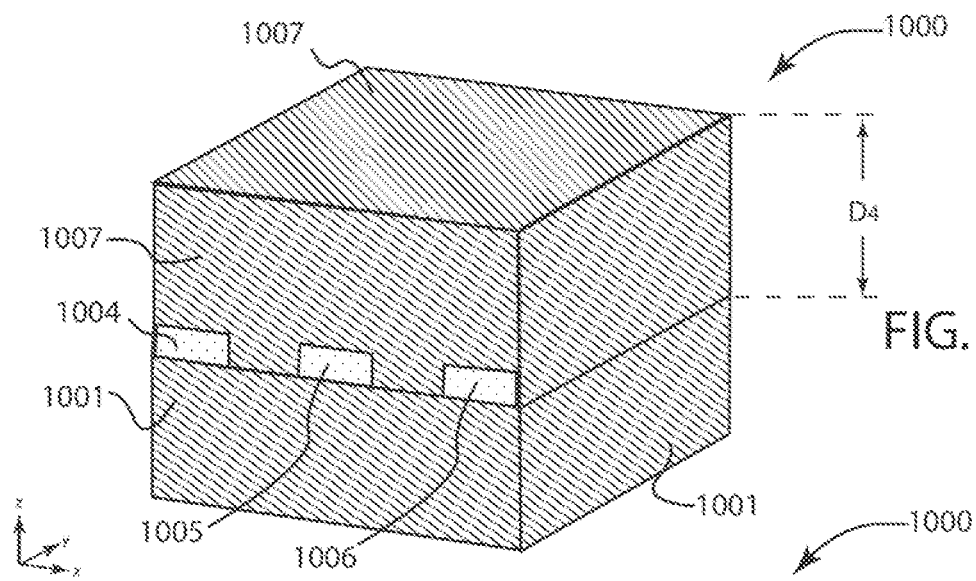
Figure 10E:
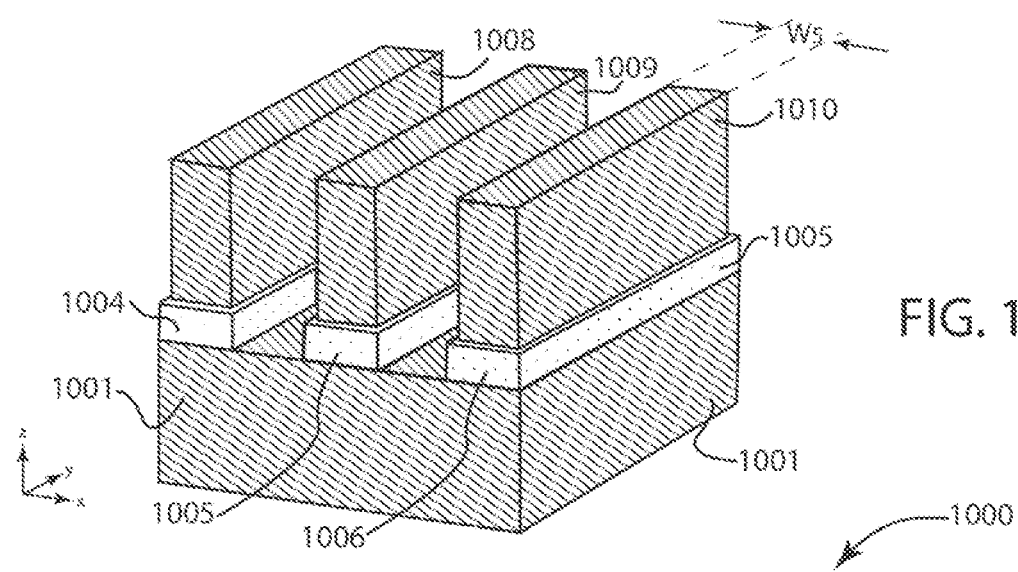
Figure 10F:
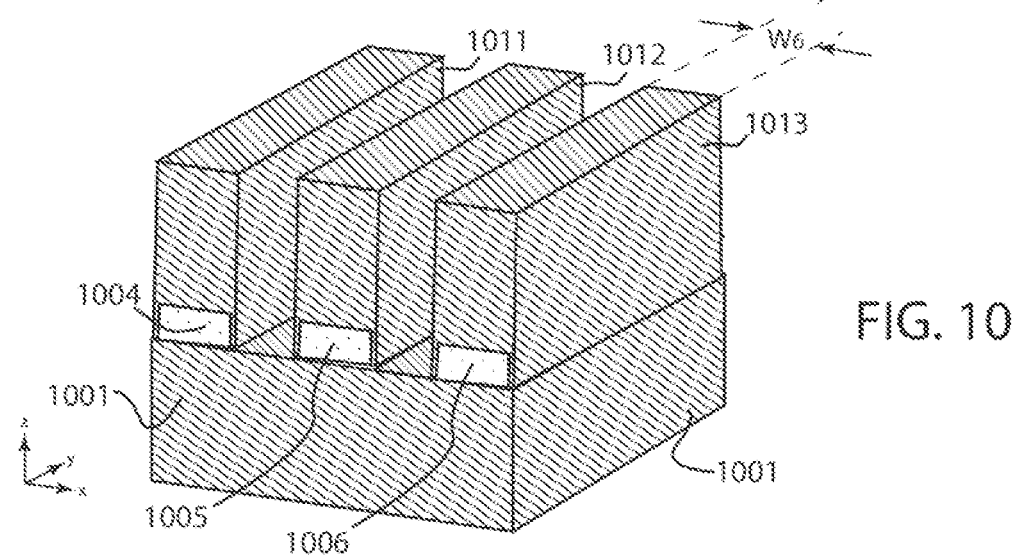

In FIG. 10D, epitaxial semiconductor layer 1007 is grown, initiated over the semiconductor surfaces between metallization structures 1004-1006, and grown out of the spaces to cover metallization structures 1004-1006. In some embodiments, epitaxial semiconductor layer 1007 is grown to thickness $D_4$, In some embodiments, $D_4$ corresponds to a specified height of the fins that are to be formed in a subsequent operation In FIG. 10E, epitaxial layer 1007 has been etched to form fins 1008-1010 directly on metallization structures 1004-

1006, respectively. In some embodiments, fins 1008-1010 may be etched to have a width $W_5$ that is smaller than conductor line width $W_3$ shown in FIG. 10C. In an alternative embodiment shown in FIG. 10F, etched fins 1011-1013 have a width $W_6$ that is equal to or larger than conductor line width $W_3$. In some embodiments, the sidewalls of fins 1011-1013 are offset from the sidewall of the metallization structures 1004-1006 by 15% or less of $W_3$ of metallization structures 1004-1006.

Figure 11:
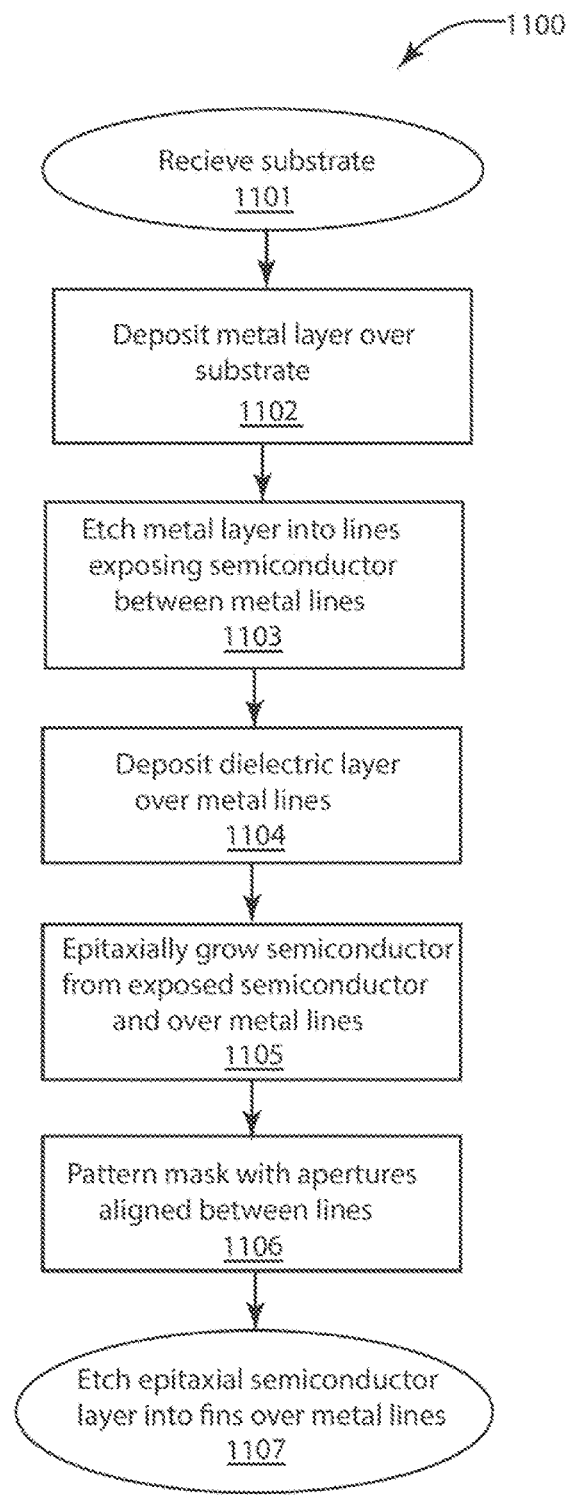
FIG. 11 illustrates a flow diagram of an exemplary method of forming fins in an epitaxial semiconductor layer grown over an intervening dielectric layer over metallization structures formed on the semiconductor substrate, in accordance with some embodiments.

FIG. 11 illustrates a method 1100 for forming fins over metal lines in an epitaxial semiconductor layer grown over an intervening dielectric layer, in accordance with some embodiments. In method 1100, operations 1101, 1102 and 1103 are substantially the same as operations 901, 902 and 903 of method 900. At operation 1104, a dielectric liner is conformally deposited over metal lines and within the spaces there between. The dielectric liner material may comprise compositions including, but not limited to, oxides of silicon, silicon nitrides, silicon oxynitride, carbon-doped oxide, MSQ, HSQ, and porous dielectrics. Deposition methods include, but are not limited to, RF and DC sputtering, evaporation, chemical vapor deposition methods such as PECVD and LPCVD, and liquid phase deposition methods. In a subsequent patterning step (not illustrated), the dielectric liner between metal lines is removed, exposing underlying semiconductor surface.

At operation 1105, an epitaxial semiconductor layer is grown from the semiconductor exposed between the metallization structures and grows over the metallization structures. Once the epitaxial semiconductor layer within the trenches has grown to approximately the thickness of the metallization structures, it may laterally grow over the metallization structures. In some embodiments, the epitaxial semiconductor is grown to a specified thickness corresponding to the height of fins that are to be fabricated in a subsequent operation. In some embodiments, the epitaxial semiconductor material is one of a group IV material such as silicon, germanium or silicon-germanium alloy, a III-V compound, such as gallium arsenide, indium phosphide, indium arsenide, a III-N material such as gallium nitride, or a II-VI compound, such as cadmium telluride, etc. In some embodiments, the epitaxial semiconductor material has the same crystallinity as the substrate material. The thickness of the epitaxial semiconductor layer is a function of growth kinetics associated with the epitaxial process, and the growth may be timed based on known growth rates to define a layer thickness. In some embodiments, the thickness of the epitaxial layer corresponds to the height of the fins that are to be fabricated in the subsequent operation.

At operation 1106, the an etch mask is applied to the epitaxial semiconductor layer such that the etch mask has apertures aligned over trenches between metallization structures. In some embodiments, the apertures have widths that are the same as the spacing between two adjacent metallization structures. In other embodiments, the apertures have widths that are different from the spacing between two adjacent metallization structures. At operation 1107, the epitaxial semiconductor layer is etched to form fins on the metallization structures. The etch process may employ wet etch and plasma etch methods, such as, but not limited to, KOH wet etch, reactive ion etching, etc.

Figure 12A:
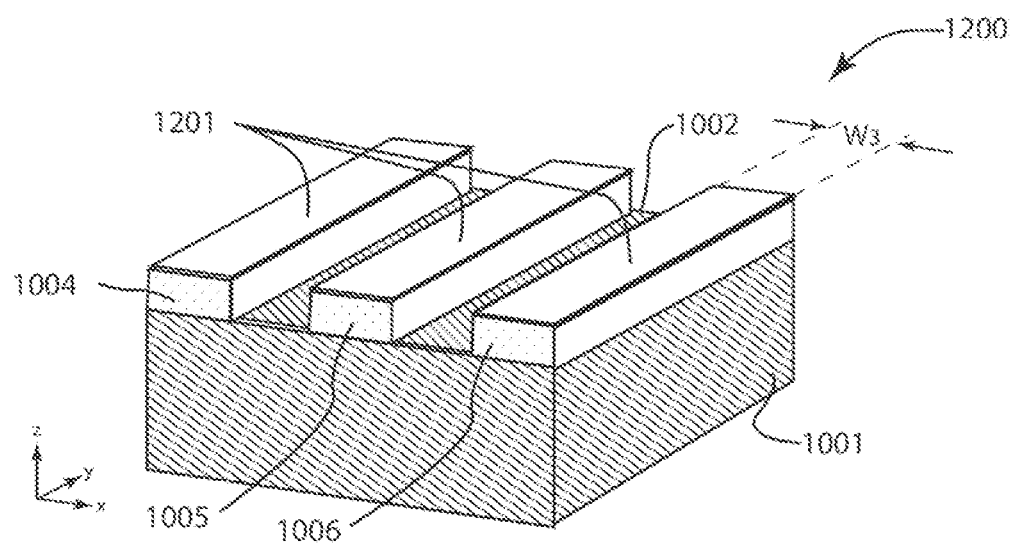
FIG. 12A-D illustrate a sequence of isometric views of epitaxial fin fabrication over metallization structures having an intervening dielectric layer, as selected operations of the exemplary method illustrated in FIG. 11 are performed, in accordance with some embodiments.
Figure 12B:
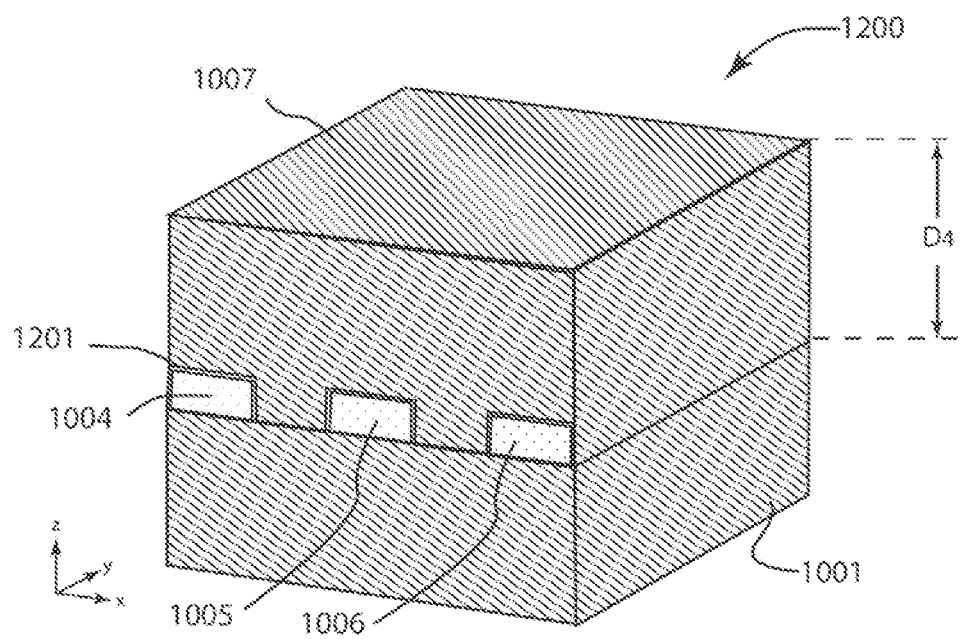

FIG. 12A-D illustrate a sequence of isometric views depicting the evolution of a semiconductor fin structure 1200 directly on metal lines, as selected operations of method 1100 are performed. In FIG. 12A, a semiconductor substrate 1001 includes a surface 1002 with metallization structures 1004-1006, for example that may have been previously formed according to operations 1101 and 1102 (FIG. 11). Dielectric liner 1201 has been deposited over metallization structures 1004-1006, for example as described in operation 1103 of exemplary method 1100. In FIG. 12B, epitaxial semiconductor layer 1007 has been grown, initiated from the semiconductor surfaces, and grown over metallization structures 1004-1006 that are capped by dielectric liner 1201. In some embodiments, epitaxial semiconductor layer 1007 may be grown to thickness $D_4$.

Figure 12C:
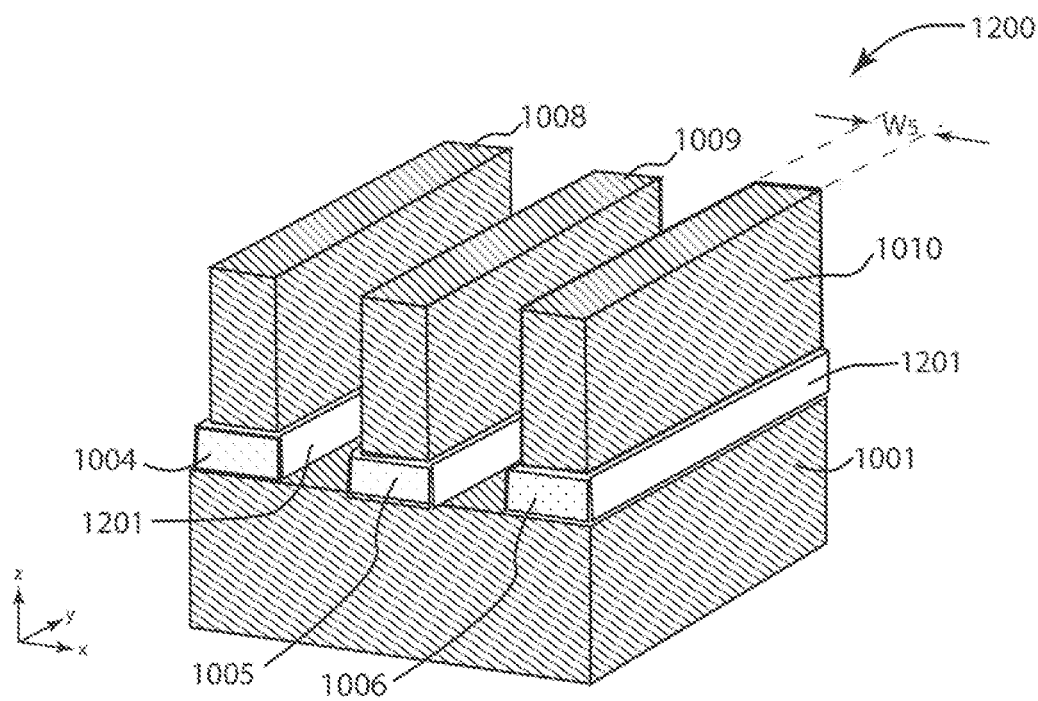
Figure 12D:
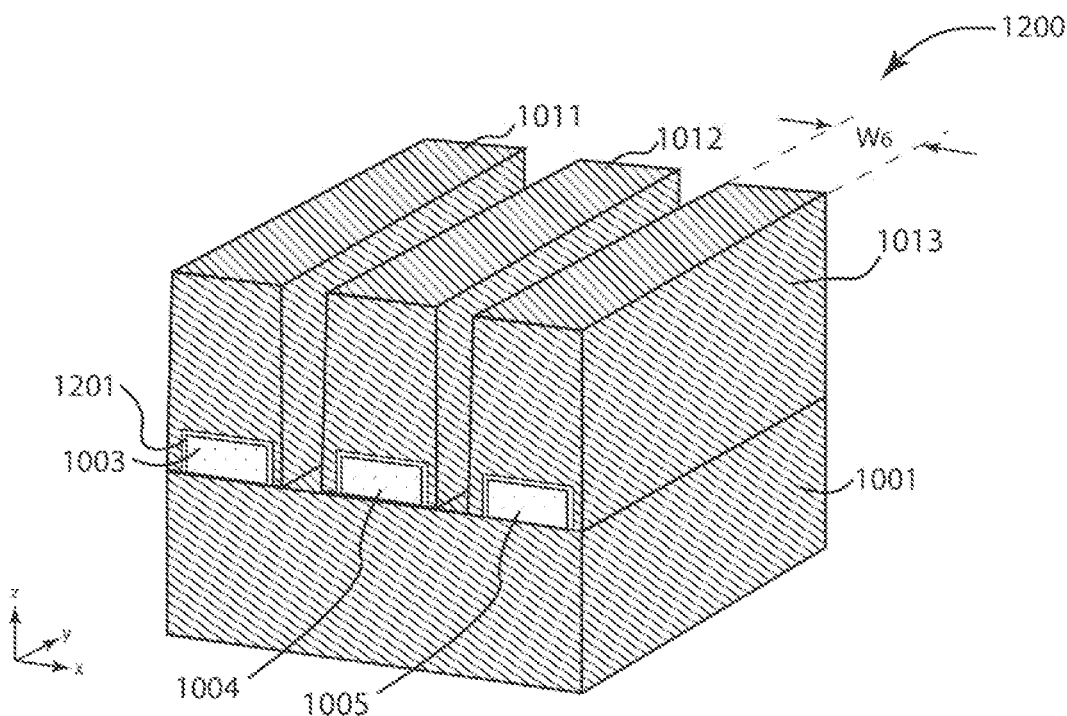

In FIG. 12C, epitaxial layer 1007 has been etched to form fins 1008-1010 directly on metallization structures 1004-1006, respectively, coated with intervening dielectric liner 1201. In some embodiments, fins 1008-1010 have a width $W_5$ that is smaller than conductor line width $W_3$ shown in FIG. 12A. In FIG. 12D, etched fins 1011-1013 have a width $W_6$ that is equal to or larger than conductor line width $W_3$.

Figure 13:
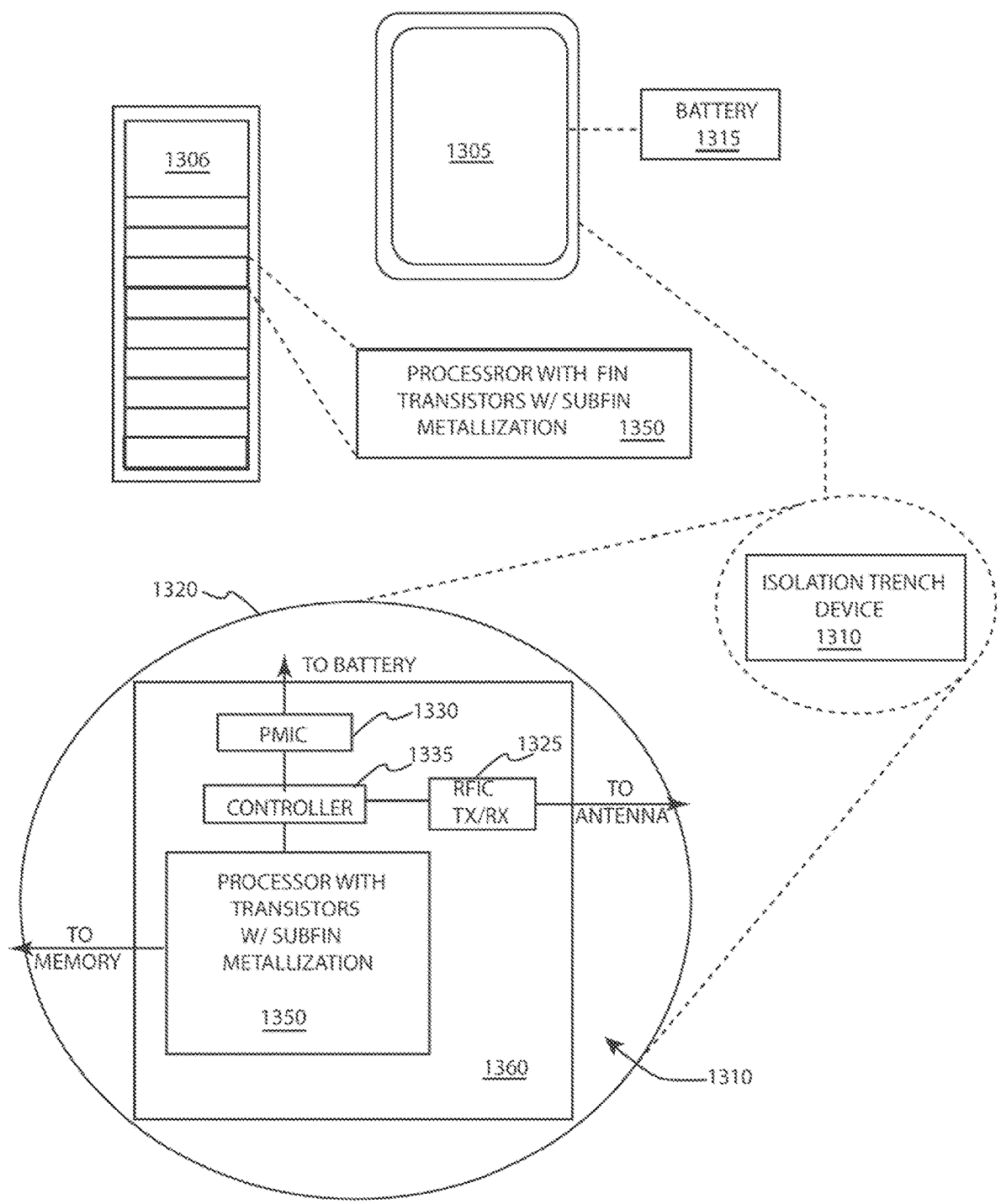
FIG. 13 illustrates a mobile computing platform and a data server machine employing an SoC including a multi-fin transistor device, in accordance with some embodiments.

FIG. 13 illustrates a system 1300 in which a mobile computing platform 1305 and/or a data server machine 1306 employs an IC, in accordance with embodiments of the present invention. In further embodiments, the IC includes any of the metallization structures described elsewhere herein. The server machine 1306 may be any commercial server, for example including any number of high-performance computing platforms disposed within a rack and networked together for electronic data processing, which in the exemplary embodiment includes a packaged monolithic IC 1350. The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen), a chip-level or package-level integrated system 1310, and a battery 1315.

Whether disposed within the integrated system 1310 illustrated in the expanded view 1320, or as a stand-alone packaged chip within the server machine 1306, packaged monolithic IC 1350 includes a memory chip (e.g., RAM), or a processor chip (e.g., a microprocessor, a multi-core microprocessor, graphics processor, or the like) including at least one finFET over a metallization structure, for example as describe elsewhere herein. The monolithic IC 1350 may be further coupled to a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller thereof 1335.

Functionally, PMIC 1330 may perform battery power regulation, DC-to-DC conversion, etc., and so has an input coupled to battery 1315 and with an output providing a current supply to other functional modules. As further illustrated, in the exemplary embodiment, RFIC 1325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1350.

Figure 14:
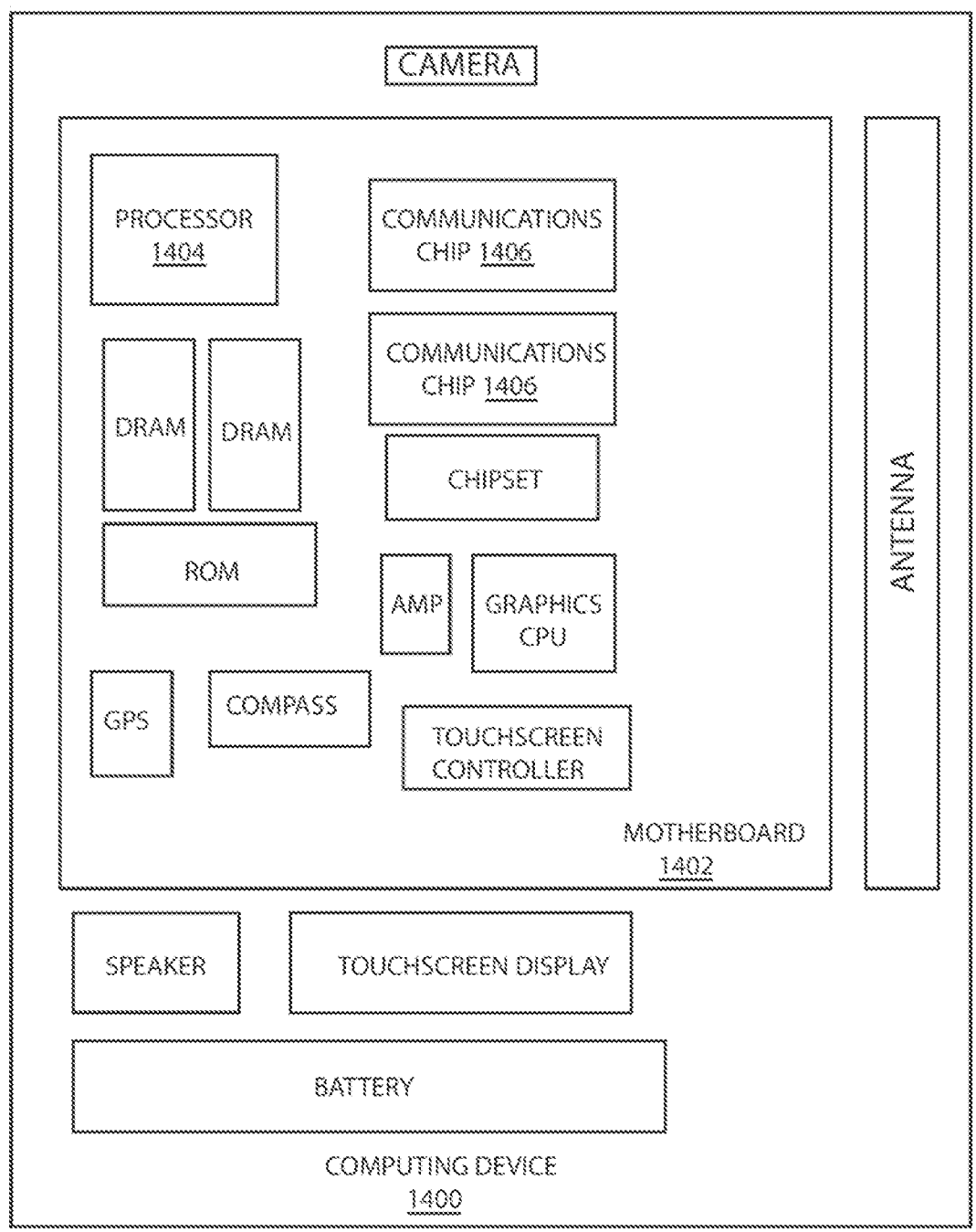
FIG. 14 is a functional block diagram of an electronic computing device, in accordance with some embodiments.

FIG. 14 is a functional block diagram of a computing device 1400, arranged in accordance with at least some implementations of the present disclosure. Computing device 1400 may be found inside platform 1305 or server machine 1306, for example. Device 1400 further includes a motherboard 1402 hosting a number of components, such as, but not limited to, a processor 1404 (e.g., an applications processor), which may further incorporate at least one finFET over a metallization structure, in accordance with embodiments of the present invention. Processor 1404 may be physically and/or electrically coupled to motherboard 1402. In some examples, processor 1404 includes an integrated circuit die packaged within the processor 1404. In general, the term "processor" or "microprocessor" may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1402. In further implementations, communication chips 1406 may be part of processor 1404. Depending on its applications, computing device 1400 may include other components that may or may not be physically and electrically coupled to motherboard 1402. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, including but not limited to those described elsewhere herein. As discussed, computing device 1400 may include a plurality of communication chips 1406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is transistor structure, comprising: a first fin comprising a semiconductor material, the first fin having a top opposite a bottom with a sidewall therebetween, wherein the bottom of the first fin has a first length and a first width; isolation comprising a dielectric material, wherein, over at least the first length, the isolation has a second width extending between the bottom of the first fin and a bottom of a second fin; one or more transistor terminals over the top or the sidewall of the first fin; and a metallization structure having at least the first length, wherein the metallization structure has approximately the first width and is in contact with the bottom of the first fin, and wherein the second width of the isolation is between the metallization structure and an adjacent metallization structure; or the metallization structure has approximately the second width, is in contact with the isolation, and is separated from the adjacent metallization structure by approximately the first width.

Example 2 includes all the features of example 1, wherein: the metallization structure has approximately the first width, and the second width of the isolation is between the metallization structure and the adjacent metallization structure; a sidewall of the metallization structure and a sidewall of the first fin are offset from each other by less than 15% of the first width; and the metallization structure is separated from at least one of the transistor terminals by a portion of the sidewall.

Example 3 includes all the features of examples 1 through 2, further comprising a plug comprising a second dielectric material, wherein: the plug has the first width and separates an end of the first fin from an end of a third fin by a second length; and the metallization structure has at least the first length summed with the second length, and is in contact with the plug.

Example 4 includes all the features of examples 1 through 3, wherein: the third fin has at least the first length; and the metallization structure has at least twice the first length summed with the second length, and is in contact with the third fin.

Example 5 includes all the features of examples 1 through 4, wherein: the metallization structure has at least the first length and approximately the second width; and a sidewall of the metallization structure is separated from the sidewall of the first fin by an intervening liner comprising a dielectric material.

Example 6 includes all the features of example 5, wherein the intervening liner separates the metallization structure from the isolation.

Example 7 includes all the features of examples 5 through 6, further comprising a plug comprising a dielectric material, wherein: the plug has the first width and separates an end of the first fin from an end of a third fin by a second length; and the metallization structure has at least the first length summed with the second length, and the plug is between the metallization structure and the adjacent metallization structure.

Example 8 includes all the features of examples 5 through 7, wherein the plug is between the metallization structure and the adjacent metallization structure over the second length; a second liner comprising a dielectric material is between the metallization structure and the plug; and a third liner comprising a dielectric material is between the plug and the adjacent metallization structure.

Example 9 includes all the features of examples 5 through 7, wherein: the third fin has at least the first length; and the metallization structure has at least twice the first length summed with the second length.

Example 10 includes all the features of examples 1 through 9, wherein: the semiconductor comprises at least one of silicon, germanium, a Group IV alloy, or a Group III-V alloy; the transistor terminals comprise a gate electrode, the gate electrode separated from the sidewall of the first fin by a gate dielectric layer; and the metallization structure comprises Cu.

Example 11 is a transistor structure, comprising: a first fin comprising a semiconductor material, the first fin having a top opposite a bottom with a sidewall of a first height therebetween, wherein the bottom of the first fin has a first length and a first width; isolation comprising a dielectric material, wherein, over at least the first length, the isolation has a second width extending between the bottom of the first fin and a bottom of a second fin; a gate stack comprising a gate electrode and a gate dielectric, the gate stack extending over a second height of the sidewall, less than the first height; a source and a drain coupled to the fin on opposite sides of the gate stack; and a metallization structure having at least the first length and separated from the gate electrode by third height of the sidewall, the third height equal to a difference between the first and second heights; and wherein: the metallization structure has approximately the first width, is in contact with the bottom of the first fin, and is separated from an adjacent metallization structure by approximately the second width; or the metallization structure has at least the first length, is in contact with the isolation, and is separated from the adjacent metallization structure by approximately the first width.

Example 12 includes all the features of example 11, wherein the source is separated from the drain by less than the first length.

Example 13 includes all the features of examples 11 through 12, wherein the metallization structure is planar with the fin bottom.

Example 14 includes all the features of example 13, wherein a sidewall of the metallization structure is separated from the fin sidewall by an intervening liner comprising a dielectric material.

Example 15 is a method of fabricating a transistor structure, the method comprising: forming fins comprising a semiconductor separated by isolation, the isolation comprising a dielectric material, and the fins having tops opposite bottoms with sidewalls of the fins therebetween; forming one or more transistor terminals over the tops or the sidewalls of one or more of the fins; and forming metallization structures in contact with the bottoms of the fins with individual ones of the metallization structures separated by the isolation, or forming metallization structures in contact with the isolation with individual ones of the metallization structures separated by the fins.

Example 16 includes all the features of example 15, forming the metallization structures further comprises forming trenches self-aligned to the fins or to the isolation by etching the fins selectively to the isolation or etching the isolation selectively to the fins; and at least partially backfilling the trenches with a metal.

Example 17 includes all the features of examples 15 through 16, wherein forming the metallization structures further comprises: exposing the isolation and the bottom of the fins; forming the trenches self-aligned to the fins by etching the isolation selectively to the fins; depositing a liner comprising dielectric material within the trenches; depositing the metal over the liner; and planarizing the metal with the fins.

Example 18 includes all the features of example 16, wherein forming the metallization structure further comprises: exposing the isolation and the bottom of the fins; forming the trenches self-aligned to the isolation by etching the fins selectively to the isolation; depositing the metal into the trenches; and planarizing the metal with the isolation.

Example 19 includes all the features of example 16, wherein forming the metallization structures further comprises: depositing a metal over a base layer comprising a semiconductor; patterning the metal into the metallization structures, the patterning exposing the base layer between adjacent ones of the metallization structures; growing semiconductor epitaxially from the base layer until the metallization structures are covered with the semiconductor; and patterning the semiconductor into the fins.

Example 20 includes all the features of example 19, wherein patterning the semiconductor into the fins further comprises etching trenches through the semiconductor, the trenches landing on the base layer.

Example 21 includes all the features of example 19, wherein patterning the semiconductor into the fins further comprises etching trenches through the semiconductor, the trenches landing on the metallization structures.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method of fabricating a transistor structure, the method comprising:
   forming features comprising a semiconductor material and separated by isolation, the isolation comprising a dielectric material, and the features having tops opposite bottoms with sidewalls therebetween;
   forming one or more transistor terminals over the tops or the sidewalls of one or more of the features;
   forming trenches self-aligned to the features by recessing the bottoms of the features selectively to the isolation or by recessing the isolation relative to the bottoms of the features;
   forming metallization structures by at least partially backfilling the trenches with a metal, wherein the metallization structures are in contact with the bottoms of the features or with the isolation, and wherein individual ones of the metallization structures are separated by either the isolation or the features.

2. The method of claim 1, wherein forming the metallization structures further comprises:
   exposing the isolation and the bottom of the features;
   forming the trenches self-aligned to the features by etching the isolation selectively to the features;
   depositing the metal within the trenches; and
   planarizing the metal with the features.

3. The method of claim 2, further comprising:
   depositing a liner comprising dielectric material within the trenches; and
   depositing the metal over the liner, wherein planarizing the metal with the features removes a portion of the liner from the bottoms of the features.

4. The method of claim 2, wherein a dielectric plug is between an end of a first of the features and an end of a second of the features, and wherein forming the trenches self-aligned to the features further comprises etching the isolation selectively to the dielectric plug.

5. The method of claim 1, wherein the semiconductor is silicon, germanium, silicon-germanium alloy.

6. The method of claim 1, wherein the features are fins having a length greater than a width.

7. The method of claim 1, wherein the isolation comprises a compound of silicon and oxygen.

8. The method of claim 1, wherein forming the metallization structure further comprises:
   exposing the isolation and the bottom of the features;
   depositing the metal into the trenches; and
   planarizing the metal with the bottoms of the features.

9. The method of claim 8, wherein a dielectric plug is between an end of a first of the features and an end of a second of the features, and wherein forming the trenches self-aligned to the features further comprises etching the dielectric plug selectively to the features.

10. The method of claim 1, wherein the semiconductor is silicon, germanium, or comprises a silicon-germanium alloy.

11. The method of claim 1, wherein the features are fins having a length greater than a width.

12. The method of claim 1, wherein the isolation comprises a compound of silicon and oxygen.

13. A method of fabricating a transistor structure, the method comprising:
   forming features comprising a semiconductor material and separated by isolation, the isolation comprising a dielectric material, and the features having tops opposite bottoms with sidewalls therebetween;
   forming one or more transistor terminals over the tops or the sidewalls of one or more of the features;
   forming trenches self-aligned to the bottoms of the features by etching the isolation selectively to the features; and
   forming metallization structures in contact with the isolation with individual ones of the metallization structures separated by the features by at least partially backfilling the trenches with a metal.

* * * * *